United States Patent
Sawada

(10) Patent No.: US 10,242,874 B2
(45) Date of Patent: Mar. 26, 2019

(54) DIFFUSING AGENT COMPOSITION AND METHOD OF MANUFACTURING SEMICONDUCTOR SUBSTRATE

(71) Applicant: TOKYO OHKA KOGYO CO., LTD., Kawasaki-shi (JP)

(72) Inventor: Yoshihiro Sawada, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 16/008,496

(22) Filed: Jun. 14, 2018

(65) Prior Publication Data

US 2018/0374704 A1 Dec. 27, 2018

(30) Foreign Application Priority Data

Jun. 23, 2017 (JP) .................................. 2017-123646
Feb. 20, 2018 (JP) .................................. 2018-028286

(51) Int. Cl.
| | |
|---|---|
| C08K 3/38 | (2006.01) |
| C08K 5/55 | (2006.01) |
| H01L 29/78 | (2006.01) |
| C09D 133/06 | (2006.01) |
| H01L 21/225 | (2006.01) |

(52) U.S. Cl.
CPC ............ *H01L 21/2254* (2013.01); *C08K 3/38* (2013.01); *C08K 5/55* (2013.01); *C09D 133/06* (2013.01); *H01L 29/785* (2013.01)

(58) Field of Classification Search
CPC ..... H01L 21/2254; H01L 29/785; C08K 5/55; C09D 133/06
See application file for complete search history.

(56) References Cited

U.S. PATENT DOCUMENTS

2015/0357499 A1* 12/2015 Komatsu ............ H01L 21/2255
136/255

FOREIGN PATENT DOCUMENTS

| JP | H06-318559 | 11/1994 |
|---|---|---|
| KR | 2015110311 | * 5/2017 |
| WO | WO 2014/064873 | 5/2014 |

* cited by examiner

*Primary Examiner* — Dale E Page
*Assistant Examiner* — Quovaunda Jefferson
(74) *Attorney, Agent, or Firm* — Knobbe Martens Olson & Bear LLP

(57) ABSTRACT

A diffusing agent composition and a method of manufacturing a semiconductor substrate using the diffusing agent composition. The diffusing agent composition contains an impurity diffusion component (A) including a first type of boron-containing compound and a second type of boron-containing compound.

9 Claims, No Drawings

DIFFUSING AGENT COMPOSITION AND METHOD OF MANUFACTURING SEMICONDUCTOR SUBSTRATE

This application claims priority to Japanese Patent Application No. 2017-123646, filed Jun. 23, 2017, and Japanese Patent Application No. 2018-028286, filed Feb. 20, 2018, the entire contents of which are incorporated herein by reference.

BACKGROUND OF THE INVENTION

Field of the Invention

The present invention relates to a diffusing agent composition which is used for diffusing an impurity diffusion component into a semiconductor substrate and a method of manufacturing a semiconductor substrate using the diffusing agent composition.

Related Art

Semiconductor substrates used in semiconductor elements such as transistors, diodes and solar batteries are manufactured by diffusing impurity diffusion components such as phosphorus and boron into the semiconductor substrates. With respect to the semiconductor substrates described above, when a semiconductor substrate for a multi-gate element such as a Fin-FET or a nanowire FET is manufactured, for example, an impurity may be diffused into a semiconductor substrate which includes, on its surface, a three-dimensional structure having small air gaps on a nanometer scale.

Here, as a method of diffusing the impurity diffusion component into the semiconductor substrate, for example, an ion implantation method (see, for example, Patent Document 1) and a CVD method (see, for example, Patent Document 2) are known. In the ion implantation method, an ionized impurity diffusion component is implanted into the surface of a semiconductor substrate. In the CVD method, an oxide film such as a silicon oxide doped with an impurity diffusion component such as phosphorus or boron is formed on a semiconductor substrate by CVD, and thereafter the semiconductor substrate having the oxide film is heated with an electric furnace or the like, with the result that the impurity diffusion component is diffused from the oxide film into the semiconductor substrate.

Patent Document 1: Japanese Unexamined Patent Application, Publication No. H06-318559

Patent Document 2: PCT International Publication No. WO2014/064873

SUMMARY OF THE INVENTION

However, in the ion implantation method as disclosed in Patent Document 1, when a light ion such as B (boron) is implanted into the semiconductor substrate, in a region near the surface of the substrate, a point defect or a point defect cluster is easily formed. For example, when an impurity diffusion component is diffused by the ion implantation method into a semiconductor substrate, and thus an element such as a CMOS image sensor is formed, the occurrence of such a defect directly leads to a reduction in the performance of the element.

For example, when a semiconductor substrate includes, on its surface, a three-dimensional structure on a nanometer scale such as a three-dimensional structure for forming a multi-gate element called a Fin-FET which includes a plurality of source fins, a plurality of drain fins and gates orthogonal to those fins, in the ion implantation method, it is difficult to uniformly implant ions into the side surface and the upper surface of the fins and gates and the entire inner surface of a concave portion surrounded by the fins and the gates. The non-uniformity of the diffusion of an impurity into a semiconductor substrate having a three-dimensional structure on a nanometer scale is also a factor for lowering the performance of an element such as the CMOS image sensor described above.

When an impurity diffusion component is diffused by the ion implantation method into a semiconductor substrate having a three-dimensional structure on a nanometer scale, even if the uniform implantation of ions is achieved, there are failures which will be described below. For example, when a semiconductor substrate which includes a three-dimensional pattern having small fins is used so as to form a logic LSI device or the like, the crystal of a substrate material such as silicon is easily damaged by ion plantation. It is considered that the damaged crystal causes a failure such as a variation in the property of the device or the production of a standby leak current.

In the semiconductor substrate which includes, on its surface, a three-dimensional structure on a nanometer scale, in order to enhance the uniformity of the diffusion of an impurity diffusion component, a coating-type diffusing agent composition is considered to be used. In the substrate which includes, on its surface, a three-dimensional structure having small air gaps on a nanometer scale, all surfaces including the entire inner surface of the small air gaps can be uniformly coated with the coating-type diffusing agent composition, and thus in the semiconductor substrate having a three-dimensional surface, an impurity such as boron can be uniformly diffused.

However, when a diffusing agent composition which contains a boron compound as an impurity diffusion component is applied onto a semiconductor substrate, a film is not formed on the surface of the semiconductor substrate so as to form small particles or to cause tarnishing, with the result that there is a tendency that a coating film whose film thickness is uniform is unlikely to be formed. When such a failure occurs at the time of formation of a coating film, it is not easy to uniformly diffuse an impurity into the surface of the semiconductor substrate.

In the coating-type diffusing agent composition, even when the time of the cycle of heating and cooling is shortened or heating at a low temperature is performed, it is preferable that an impurity can be satisfactorily diffused. Although it is further necessary to control the length of diffusion as a result of realization of three-dimensional structures, it is considered that diffusion is performed by heating at a low temperature and that thus it is possible to shorten the length of diffusion.

The present invention is made in view of the foregoing problems, and an object thereof is to provide: a diffusing agent composition where even when a semiconductor substrate into which an impurity diffusion component is diffused includes, on its surface, a three-dimensional structure having, on its surface, small air gaps on a nanometer scale, on the surfaces of the semiconductor substrate including the entire inner surface of the small air gaps, a coating film can be formed whose film thickness is uniform and which is homogeneous without tarnishing, and where thus even when heating is performed, for example, at a low temperature equal to or less than 1000° C., it is possible to satisfactorily and uniformly diffuse boron into the semiconductor substrate; and a method of manufacturing a semiconductor substrate using the diffusing agent composition described above.

The present inventors find that it is possible to solve the foregoing problems by containing, in a diffusing agent composition containing an impurity diffusion component (A), as the impurity diffusion component (A), a first boron compound and a second boron compound which are two types of specific boron compounds, and thereby complete the present invention. More specifically, the present invention provides the followings.

A first aspect of the present invention is a diffusing agent composition which is used for diffusing an impurity into a semiconductor substrate, where the diffusing agent composition contains an impurity diffusion component (A), the impurity diffusion component (A) contains a first boron compound (A1) and a second boron compound (A2), the first boron compound (A1) is a boron hydride or a boron compound which can generate, by hydrolysis, one or more types of compounds selected from a group consisting of compounds represented by a formula (a1e) and a formula (a1f) below:

$$B(R^{1a})_2OH \quad \quad (a1e)$$

$$B(R^{1a})(OH)_2 \quad \quad (a1f)$$

(in the formulas (a1e) and (a1f), $R^{1a}$ represents a hydrogen atom or a hydrocarbon group having 1 to 10 carbon atoms) and the second boron compound (A2) is a boron compound other than the first boron compound (A1) and one or more types selected from a group consisting of compounds represented by formulas (a2a) to (a2d) below:

[Formula 1]

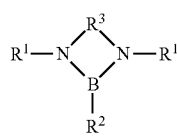

(a2a)

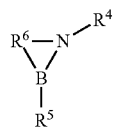

(a2b)

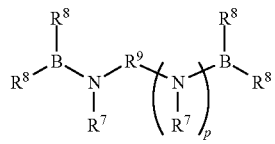

(a2c)

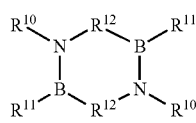

(a2d)

(in the formula (a2a), $R^1$ each independently represents a hydrogen atom, a hydrocarbon group having 1 to 10 carbon atoms, $R^2$ represents a hydrogen atom or a hydrocarbon group having 1 to 10 carbon atoms, at least one of $R^1$ and $R^2$ is a hydrocarbon group and $R^3$ represents a divalent aliphatic hydrocarbon group having 1 to 10 carbon atoms;

in the formula (a2b), $R^4$ represents a hydrocarbon group having 1 to 10 carbon atoms, $R^5$ represents a hydrogen atom or a hydrocarbon group having 1 to 10 carbon atoms and $R^6$ represents a divalent aliphatic hydrocarbon group having 1 to 10 carbon atoms;

in the formula (a2c), $R^7$ each independently represents a hydrocarbon group having 1 to 10 carbon atoms, $R^8$ each independently represents a hydrogen atom or a hydrocarbon group having 1 to 10 carbon atoms, $R^9$ represents a divalent hydrocarbon group having 1 to 10 carbon atoms and p represents 0 or 1; and in the formula (a2d), $R^{1C}$ each independently represents a hydrogen atom, a hydrocarbon group having 1 to 10 carbon atoms, $R^{11}$ each independently represents a hydrogen atom or a hydrocarbon group having 1 to 10 carbon atoms, at least one of $R^{10}$ and $R^{11}$ is a hydrocarbon group and $R^{12}$ each independently represents a divalent hydrocarbon group having 1 to 10 carbon atoms).

A second aspect of the present invention is a method of manufacturing a semiconductor substrate which includes: forming a coating film by applying the diffusing agent composition according to the first aspect onto a semiconductor substrate; and diffusing the impurity diffusion component (A) in the diffusing agent composition into the semiconductor substrate.

According to the present invention, it is possible to provide: a diffusing agent composition where even when a semiconductor substrate into which an impurity diffusion component is diffused includes, on its surface, a three-dimensional structure having, on its surface, small air gaps on a nanometer scale, on the surfaces of the semiconductor substrate including the entire inner surface of the small air gaps, a coating film can be formed whose film thickness is uniform and which is homogeneous without tarnishing, and where thus even when heating is performed, for example, at a low temperature equal to or less than 1000° C., it is possible to satisfactorily and uniformly diffuse boron into the semiconductor substrate; and a method of manufacturing a semiconductor substrate using the diffusing agent composition described above.

DETAILED DESCRIPTION OF THE INVENTION

«Diffusing Agent Composition»

A diffusing agent composition is used for diffusing an impurity into a semiconductor substrate, and contains an impurity diffusion component (A). The impurity diffusion component (A) contains a first boron compound and a second boron compound which will be described later. By use of the impurity diffusion component (A), the diffusing agent composition is used, and thus it is possible to satisfactorily diffuse boron into the semiconductor substrate. The diffusing agent composition described above is used, and thus even when the semiconductor substrate into which the impurity diffusion component is diffused includes, on its surface, a three-dimensional structure having, on its surface, small air gaps on a nanometer scale, on the surfaces of the semiconductor substrate including the entire inner surface of the small air gaps, a coating film can be formed whose film thickness is uniform and which is homogeneous without tarnishing. In this way, boron is uniformly diffused into the semiconductor substrate.

Essential or arbitrary components included in the diffusing agent composition will be described below.

[Impurity Diffusion Component (A)]

The impurity diffusion component (A) is applied to the surface of the semiconductor substrate so as to be able to form a diffusion layer, and contains boron compounds. The impurity diffusion component (A) contains the first boron compound (A1) and the second boron compound (A2).

<First Boron Compound>

The first boron compound (A1) is a boron hydride or a boron compound which can generate, by hydrolysis, one or more types of compounds selected from a group consisting of compounds represented by a formula (a1e) and a formula (a1f) below:

$$B(R^{1a})_2OH \qquad (a1e)$$

$$B(R^{1a})(OH)_2 \qquad (a1f)$$

(in the formulas (a1e) and (a1f), $R^{1a}$ represents a hydrogen atom or a hydrocarbon group having 1 to 10 carbon atoms). When the impurity diffusion component (A) is applied to the semiconductor substrate so as to form a film, the first boron compound generates, by hydrolysis, a compound having a B—OH group such as the formula (a1e) or the formula (a1f). The boron hydride also generates, by hydrolysis, a decomposed product having a B—OH group. It is estimated that the compound represented by the formula (a1e) or the formula (a1f) and the decomposed product of the boron hydride appropriately attract moisture into a reaction system so as to assist a hydrolysis reaction, with the result that it is considered that a failure in the coating film is reduced and thus the uniformity of the film is enhanced.

In the formulas (a1e) and (a1f), $R^{1a}$ represents a hydrogen atom or a hydrocarbon group having 1 to 10 carbon atoms. The hydrocarbon group serving as $R^{1a}$ may be an aliphatic hydrocarbon group, an aromatic hydrocarbon group or a group obtained by combining them. Specific examples of the suitable hydrocarbon group include: alkyl groups such as a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethylhexyl group, an n-nonyl group and an n-decyl group; cycloalkyl groups such as a cyclopropyl group, a cyclobutyl group, a cyclopentyl group, a cyclohexyl group, a cycloheptyl group, a cyclooctyl group, a cyclononyl group and a cyclodecyl group; alkenyl groups such as a vinyl group, an allyl group (2-propenyl group), a 3-butenyl group, a 4-pentenyl group and a 5-hexenyl group; aromatic hydrocarbon groups such as a phenyl group, a naphthalen-1-yl group and a naphthalen-2-yl group; aralkyl groups such as a benzyl group and a phenethyl group; alkyl-substituted aromatic hydrocarbon groups such as an o-tolyl group, a m-tolyl group, a p-tolyl group, an o-ethylphenyl group, a m-ethylphenyl group and a p-ethylphenyl group.

The first boron compound (A1) is preferably one or more types selected from a group consisting of a boron hydride having 2 to 10 boron atoms and compounds represented by formulas (a1a) to (a1d) below:

$$B(R^{13})_q(OR^{14})_{(3-q)} \qquad (a1a)$$

[Formula 2]

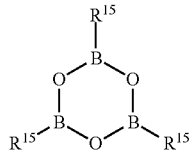 (a1b)

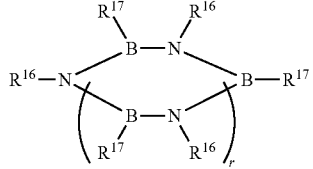 (a1c)

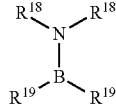 (a1d)

(in the formula (a1a), $R^{13}$ and $R^{14}$ each independently represent a hydrocarbon group having 1 to 10 carbon atoms, and q represents an integer of 1 or 2; in the formula (a1b), $R^{15}$ each independently represents a hydrocarbon group having 1 to 10 carbon atoms; in the formula (a1c), $R^{16}$ each independently represents a hydrocarbon group having 1 to 10 carbon atoms, $R^{17}$ represents a hydrogen atom or each independently represents a hydrocarbon group having 1 to 10 carbon atoms and r represents 1 or 2; and in the formula (a1d), $R^{18}$ and $R^{19}$ each independently represent a hydrogen atom or a hydrocarbon group having 1 to 10 carbon atoms). Preferred examples of the first boron compound will be described below.

(Boron Hydride)

As the boron hydride having 2 to 10 boron atoms, a known borohydride compound can be used. Examples of the suitable boron hydride include borane, diborane, tetraborane, pentaborane, and decaborane. Among them, decaborane is preferable because it is easily available and is satisfactorily handled.

(Compound Represented by Formula (a1a))

In the formula (a1a), $R^{13}$ and $R^{14}$ each independently represent a hydrocarbon group having 1 to 10 carbon atoms, and q represents an integer of 1 or 2. Here, q is preferably 1. When in the formula (a1a), a plurality of $R^{13}$s or $R^{14}$s are provided, $R^{13}$s or $R^{14}$s may be the same as or different from each other. Examples of the suitable hydrocarbon group having 1 to 10 carbon atoms which serves as $R^{13}$ and $R^{14}$ are the same as the examples of the suitable $R^{1a}$.

Specific examples of the suitable compound represented by the formula (a1a) include dimethyl methyl boronate, diethyl methyl boronate, di-n-propyl methyl boronate, di-n-butyl methyl boronate, dimethyl ethyl boronate, diethyl ethyl boronate, di-n-propyl ethyl boronate, di-n-butyl ethyl boronate, dimethyl n-propyl boronate, diethyl n-propyl boronate, di-n-propyl n-propyl boronate, di-n-butyl n-propyl boronate, diisopropyl allyl boronate, dimethyl vinyl boronate, diethyl vinyl boronate, di-n-propyl vinyl boronate, di-n-butyl vinyl boronate, dimethyl phenyl boronate, diethyl phenyl boronate, di-n-propyl phenyl boronate and di-n-butyl phenyl borate.

(Compound Represented by Formula (a1b))

In the formula (a1b), $R^{15}$ each independently represents a hydrocarbon group having 1 to 10 carbon atoms. In the formula (a1b), a plurality of $R^{15}$s may be the same as or different from each other. Examples of the suitable hydrocarbon group having 1 to 10 carbon atoms which serves as $R^{15}$ are the same as the examples of the suitable $R^{1a}$.

Specific examples of the compound represented by the formula (a1b) include compounds below.

[Formula 3]

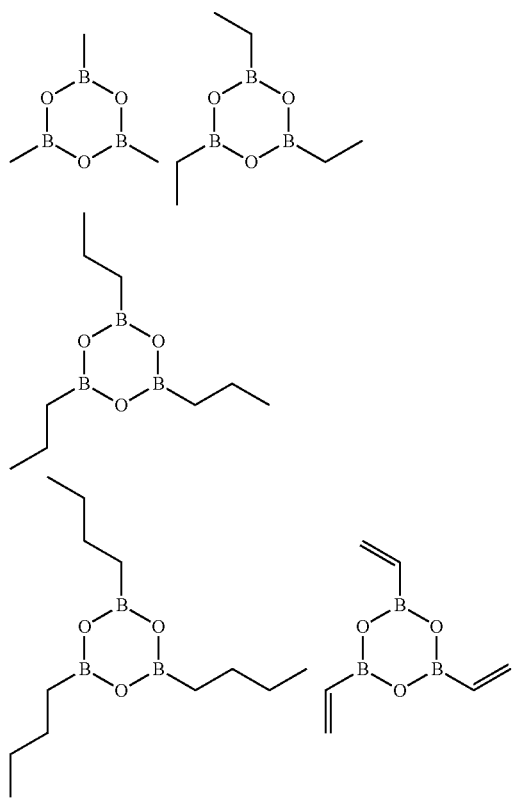

(Compound Represented by Formula (a1c))

In the formula (a1c), $R^{16}$ and $R^{17}$ each independently represent a hydrocarbon group having 1 to 10 carbon atoms, and r represents 1 or 2. Examples of the suitable hydrocarbon group having 1 to 10 carbon atoms which serves as $R^{16}$ and $R^{17}$ are the same as the examples of the suitable $R^{1a}$.

Specific examples of the compound represented by the formula (a1c) include compounds below.

[Formula 4]

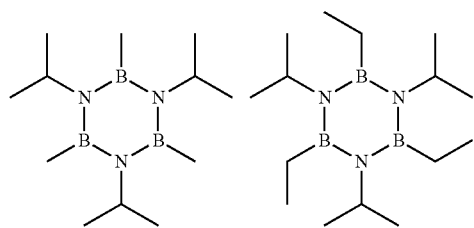

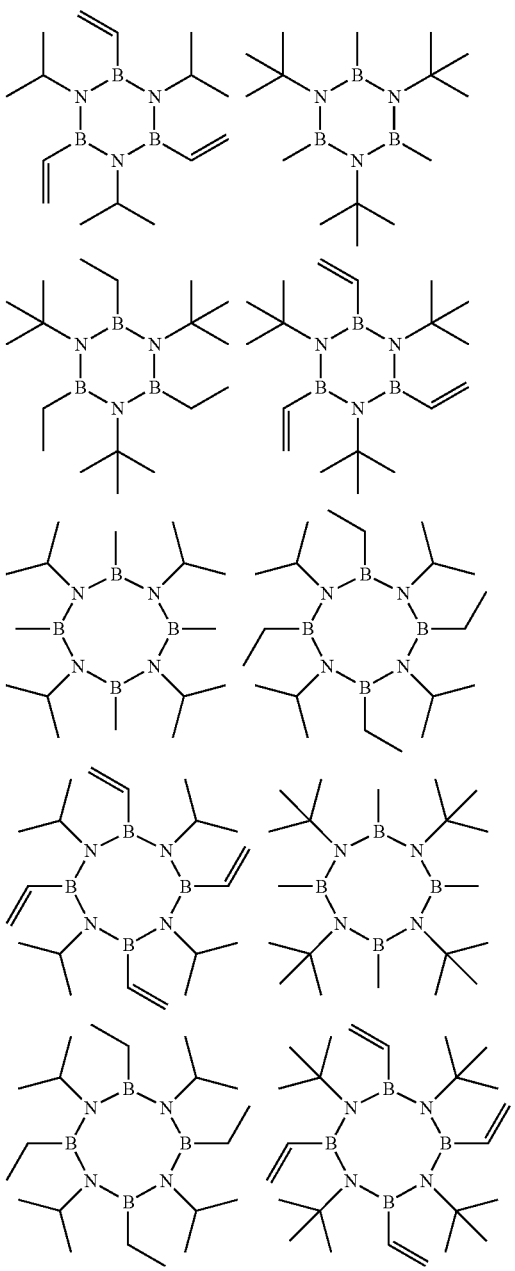

In the formula (a1d), $R^{18}$ and $R^{19}$ each independently represent a hydrogen atom or a hydrocarbon group having 1 to 10 carbon atoms. Examples of the suitable hydrocarbon group having 1 to 10 carbon atoms which serves as $R^{18}$ and $R^{19}$ are the same as the examples of the suitable $R^{1a}$. Examples of the suitable compound represented by the formula (a1d) include dimethyl aminoborane, diethyl aminoborane, di-n-propyl aminoborane and diisopropyl aminoborane.

<Second Boron Compound>

The second boron compound (A2) is a boron compound other than the first boron compound (A1). The second boron compound is one or more types selected from a group consisting of compounds represented by formulas (a2a) to (a2d) below:

[Formula 5]

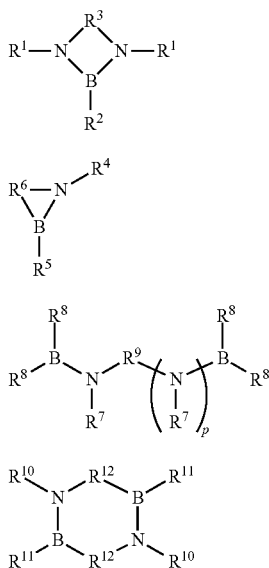

(a2a)
(a2b)
(a2c)
(a2d)

(in the formula (a2a), $R^1$ each independently represents a hydrogen atom, a hydrocarbon group having 1 to 10 carbon atoms, $R^2$ represents a hydrogen atom or a hydrocarbon group having 1 to 10 carbon atoms, at least one of $R^1$ and $R^2$ is a hydrocarbon group and $R^3$ represents a divalent aliphatic hydrocarbon group having 1 to 10 carbon atoms;

in the formula (a2b), $R^4$ represents a hydrocarbon group having 1 to 10 carbon atoms, $R^5$ represents a hydrogen atom or a hydrocarbon group having 1 to 10 carbon atoms and $R^6$ represents a divalent aliphatic hydrocarbon group having 1 to 10 carbon atoms;

in the formula (a2c), $R^7$ each independently represents a hydrocarbon group having 1 to 10 carbon atoms, $R^8$ each independently represents a hydrogen atom or a hydrocarbon group having 1 to 10 carbon atoms, $R^9$ represents a divalent hydrocarbon group having 1 to 10 carbon atoms and p represents 0 or 1; and in the formula (a2d), $R^{10}$ each independently represents a hydrogen atom, a hydrocarbon group having 1 to 10 carbon atoms, $R^{11}$ each independently represents a hydrogen atom or a hydrocarbon group having 1 to 10 carbon atoms, at least one of $R^{10}$ and $R^{11}$ is a hydrocarbon group and $R^{12}$ each independently represents a divalent hydrocarbon group having 1 to 10 carbon atoms).

The divalent aliphatic hydrocarbon group is bonded to the nitrogen atom in the B—N bond, and the hydrogen atom is not simultaneously bonded to the boron atom and the nitrogen atom in the B—N bond. It is estimated that the commonality of this structure can reduce the generation of an inorganic compound such as boron from the second boron compound by hydrolysis and can reduce the non-uniformity of the film caused by increasing the amount of inorganic compound, and that thus the formation of the homogenous coating film is encouraged. The compounds represented by formulas (a2a) to (a2d) will be described below.

(Compound Represented by Formula (a2a))

In the formula (a2a), $R^1$ each independently represents a hydrogen atom, a hydrocarbon group having 1 to 10 carbon atoms, $R^2$ represents a hydrogen atom or a hydrocarbon group having 1 to 10 carbon atoms and $R^3$ represents a divalent aliphatic hydrocarbon group having 1 to 10 carbon atoms. Here, at least one of $R^1$ and $R^2$ is a hydrocarbon group. Examples of the suitable hydrocarbon group having 1 to 10 carbon atoms which serves as $R^1$ and $R^2$ are the same as the examples of the suitable $R^{1a}$. As $R^1$, a methyl group, an ethyl group, an n-propyl group, an isopropyl group, an n-butyl group, an isobutyl group, a sec-butyl group, a tert-butyl group, a phenyl group and a benzyl group are preferable. As $R^2$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable.

Although the aliphatic hydrocarbon group serving as $R^3$ may be linear or branched, the aliphatic hydrocarbon group is preferably linear. Examples of the suitable $R^3$ include a methylene group, an ethane-1,2-diyl group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group and a decane-1,10-diyl group. As $R^3$, the ethane-1,2-diyl group and the propane-1,3-diyl group are preferable.

Specific examples of the compound represented by the formula (a2a) include compounds below.

[Formula 6]

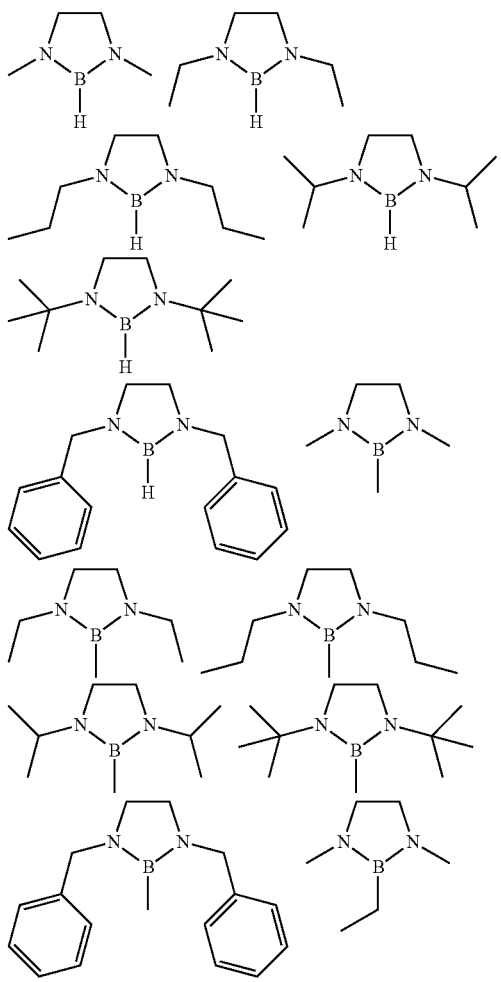

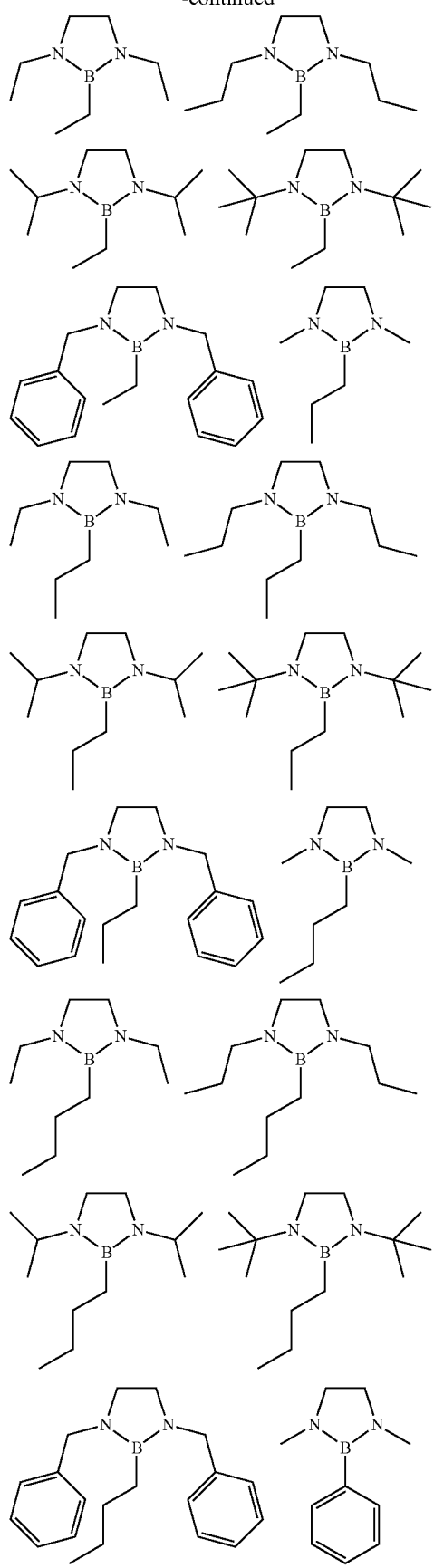
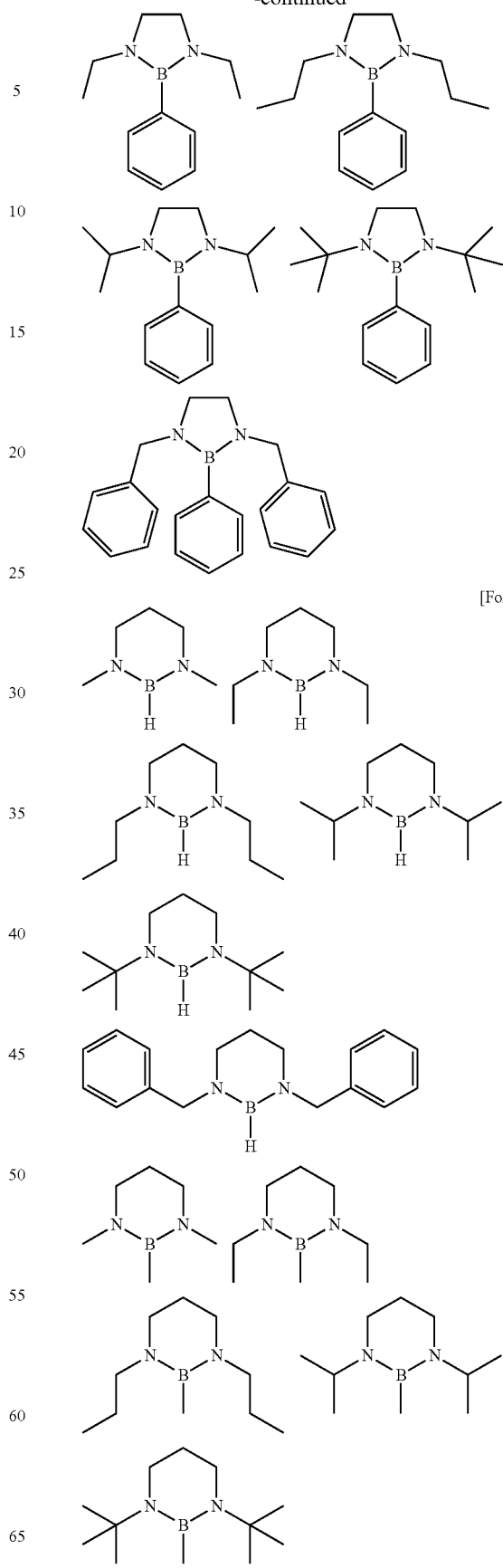
[Formula 7]

-continued
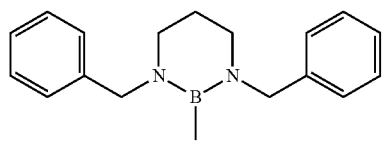
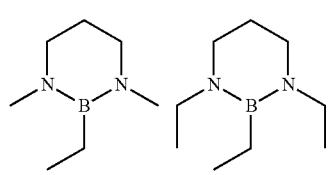
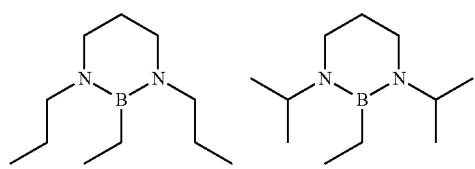
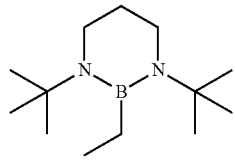
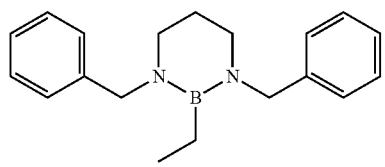
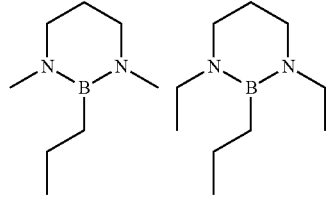
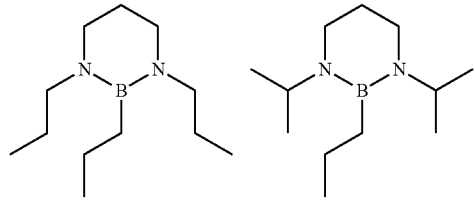
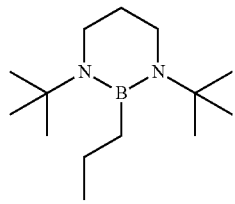
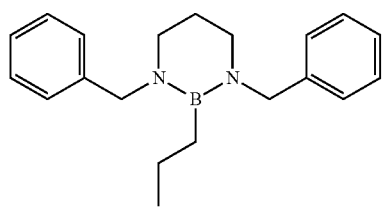
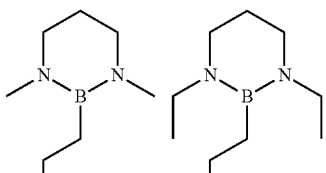
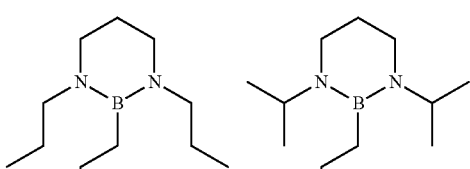
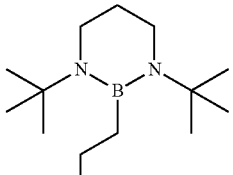
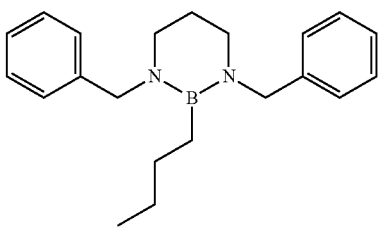
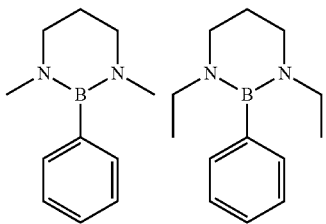
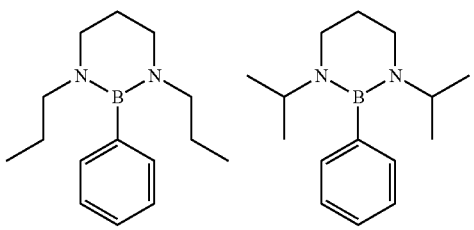
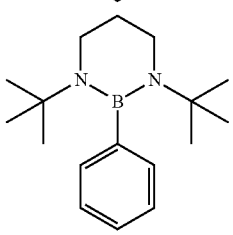

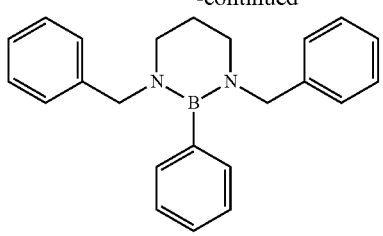

(Compound Represented by Formula (a2b))

In the formula (a2b), $R^4$ represents a hydrocarbon group having 1 to 10 carbon atoms, $R^5$ represents a hydrogen atom or a hydrocarbon group having 1 to 10 carbon atoms and $R^6$ represents a divalent aliphatic hydrocarbon group having 1 to 10 carbon atoms. Examples of the suitable hydrocarbon group having 1 to 10 carbon atoms which serves as $R^4$ and $R^5$ are the same as the examples of the suitable $R^{1a}$. As $R^4$, a methyl group, an ethyl group, an n-propyl group, an isopropyl group, an n-butyl group, an isobutyl group, a sec-butyl group, a tert-butyl group, a phenyl group and a benzyl group are preferable. As $R^5$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable. Examples of the suitable divalent aliphatic hydrocarbon group having 1 to 10 carbon atoms which serves as $R^6$ are the same as the examples of the suitable $R^3$. As $R^6$, a propane-1,3-diyl group and a butane-1,4-diyl group are preferable.

Specific examples of the compound represented by the formula (a2a) include compounds below.

[Formula 8]

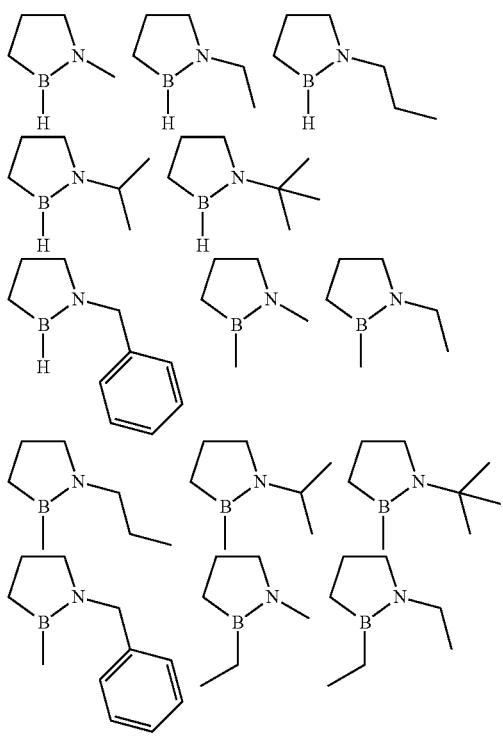

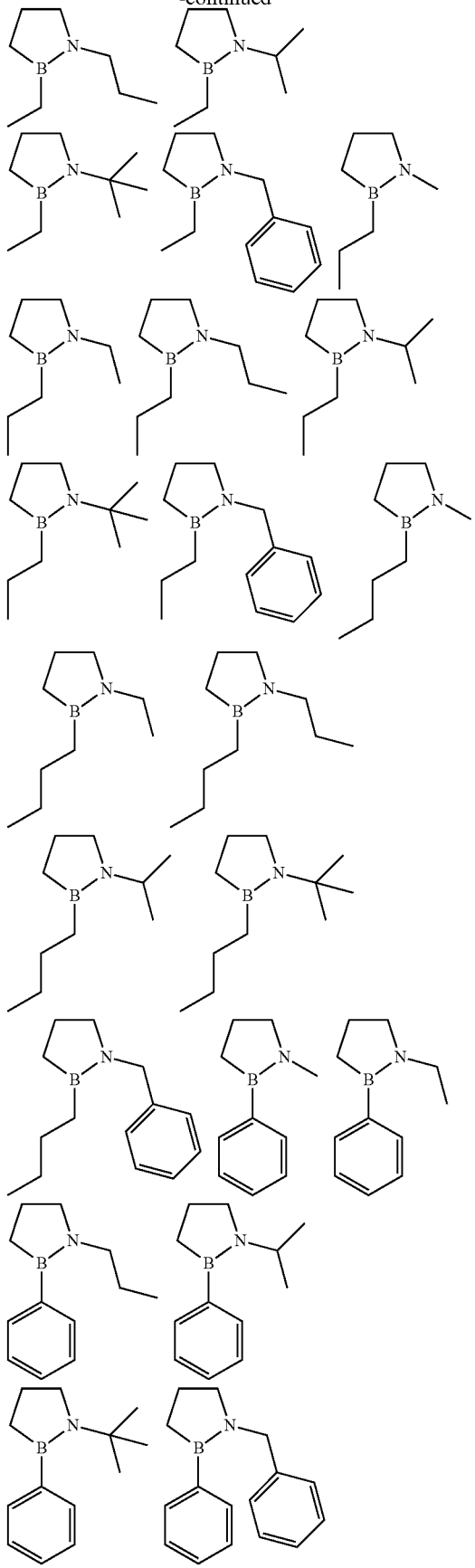

[Formula 9]

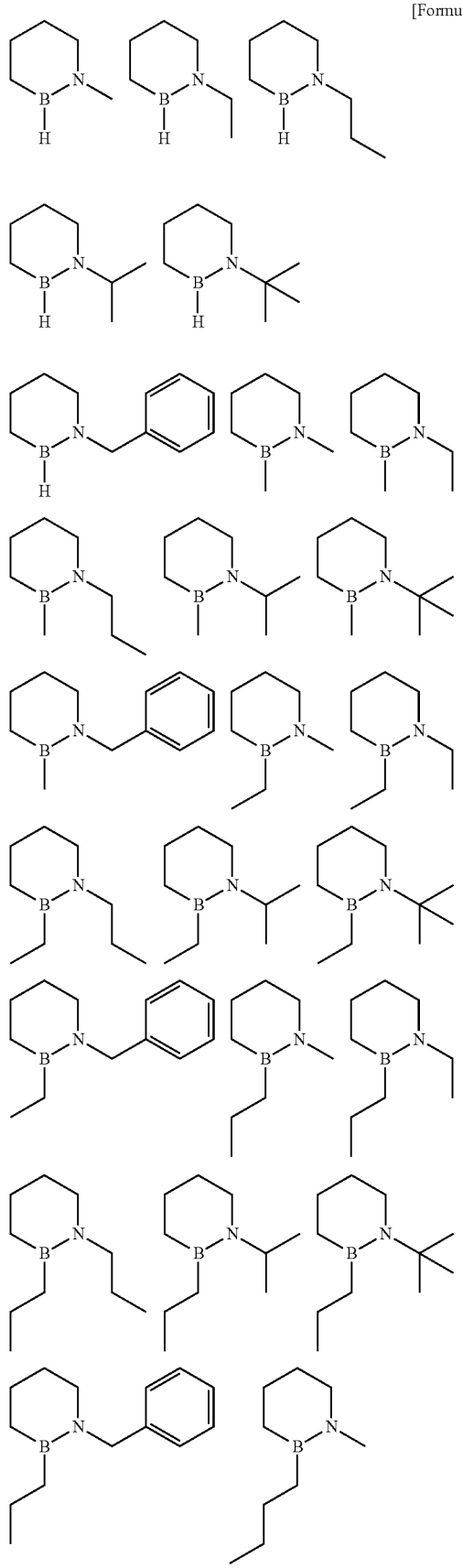

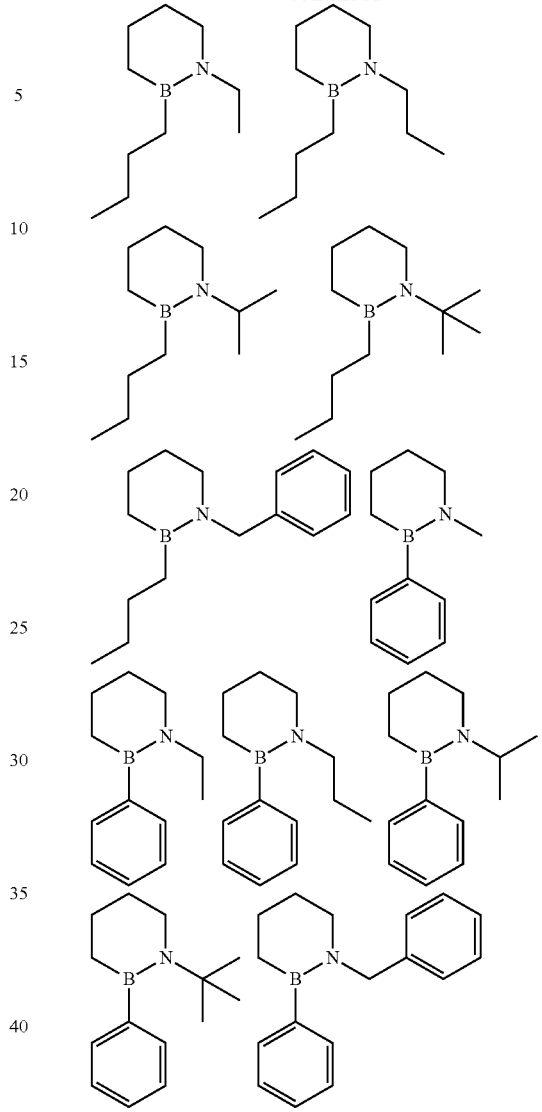

(Compound Represented by Formula (a2c))

In the formula (a2c), $R^7$ each independently represents a hydrocarbon group having 1 to 10 carbon atoms, $R^8$ each independently represents a hydrogen atom or a hydrocarbon group having 1 to 10 carbon atoms, $R^9$ represents a divalent hydrocarbon group having 1 to 10 carbon atoms and p represents 0 or 1. Here, p is preferably 1. Examples of the suitable hydrocarbon group having 1 to 10 carbon atoms which serves as $R^7$ and $R^8$ are the same as the examples of the suitable $R^{1a}$. As $R^7$, a methyl group, an ethyl group, an n-propyl group, an isopropyl group, an n-butyl group, an isobutyl group, a sec-butyl group, a tert-butyl group, a phenyl group and a benzyl group are preferable, and the tert-butyl group and the benzyl group are more preferable. As $R^8$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable, and the methyl group, the ethyl group and the n-propyl group are more preferable. Examples of the suitable divalent aliphatic hydrocarbon group having 1 to 10 carbon atoms which serves as $R^9$ are the same as the examples of the suitable $R^3$.

As $R^9$, an ethane-1,2-diyl group, a propane-1,3-diyl group and a butane-1,4-diyl group are preferable.
Specific examples of the compound represented by the formula (a2c) include compounds below.
[Formula 10]
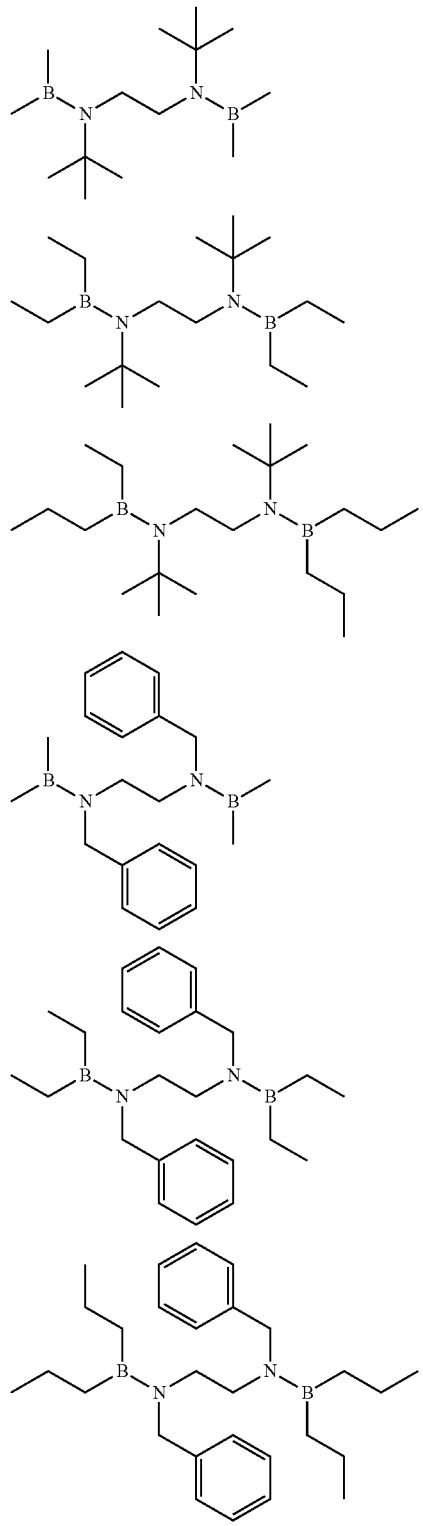
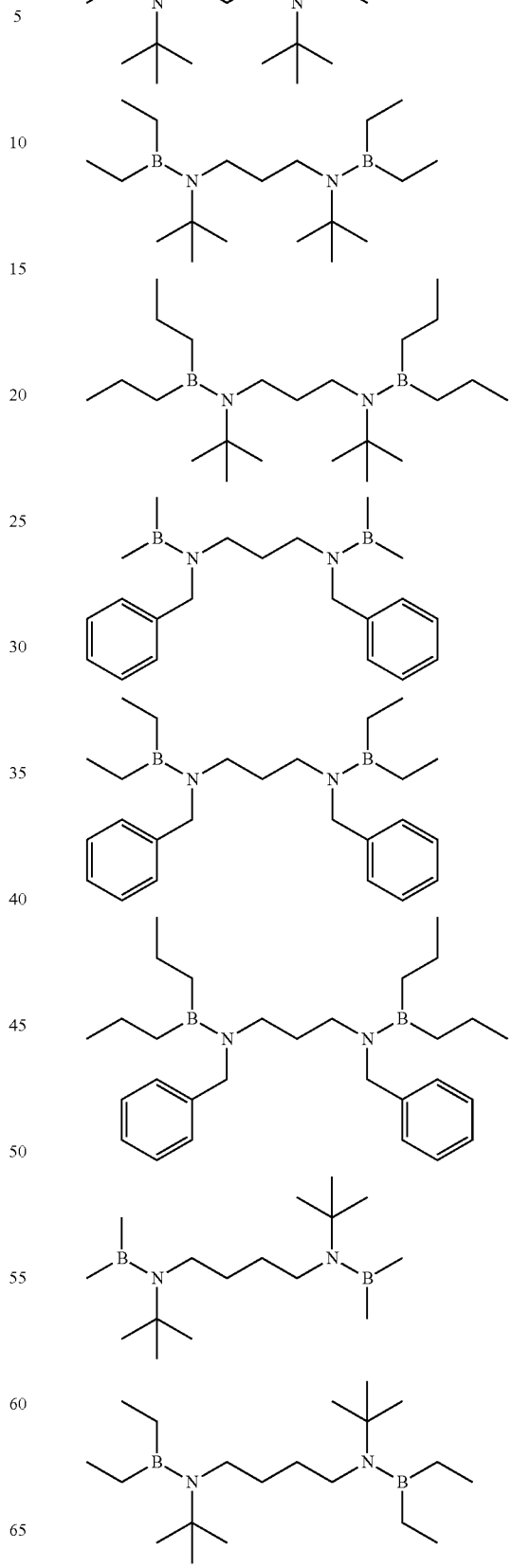

-continued

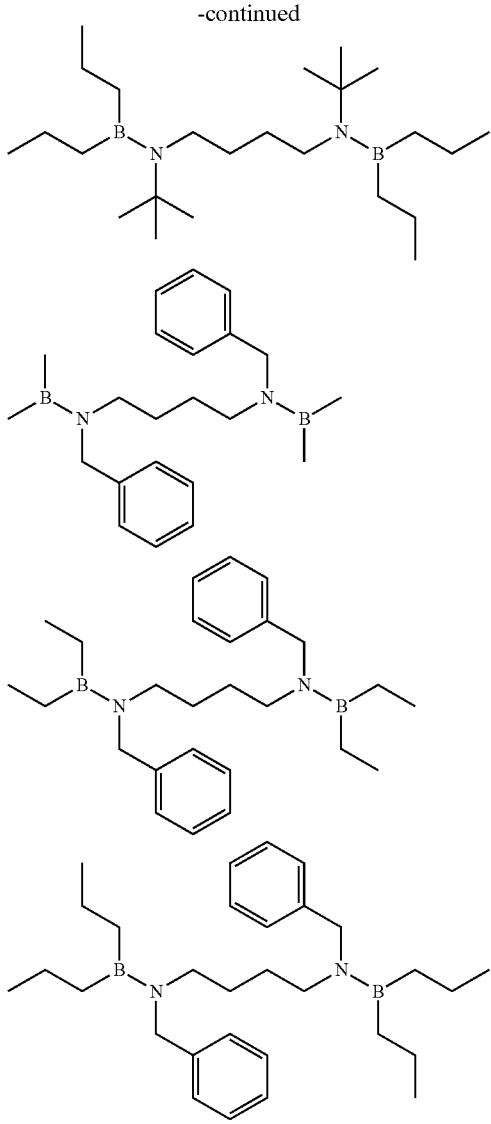

(Compound Represented by Formula (a2d))

In the formula (a2d), $R^{10}$ each independently represents a hydrogen atom, a hydrocarbon group having 1 to 10 carbon atoms, $R^{11}$ each independently represents a hydrogen atom or a hydrocarbon group having 1 to 10 carbon atoms, at least one of $R^{10}$ and $R^{11}$ is a hydrocarbon group and $R^{12}$ each independently represents a divalent hydrocarbon group having 1 to 10 carbon atoms. Examples of the suitable hydrocarbon group having 1 to 10 carbon atoms which serves as $R^{10}$ and $R^{11}$ are the same as the examples of the suitable $R^{1\alpha}$. As $R^{10}$, a methyl group, an ethyl group, an n-propyl group, an isopropyl group, an n-butyl group, an isobutyl group, a sec-butyl group, a tert-butyl group, a phenyl group and a benzyl group are preferable, and the tert-butyl group and the benzyl group are more preferable. As $R^{11}$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable, and the methyl group, the ethyl group and the n-propyl group are more preferable. Examples of the suitable divalent aliphatic hydrocarbon group having 1 to 10 carbon atoms which serves as $R^{12}$ are the same as the examples of the suitable $R^3$. As $R^{12}$, a methylene group and an ethane-1,2-diyl group are preferable, and the methylene group is more preferable.

Specific examples of the compound represented by the formula (a2d) include compounds below.

[Formula 11]

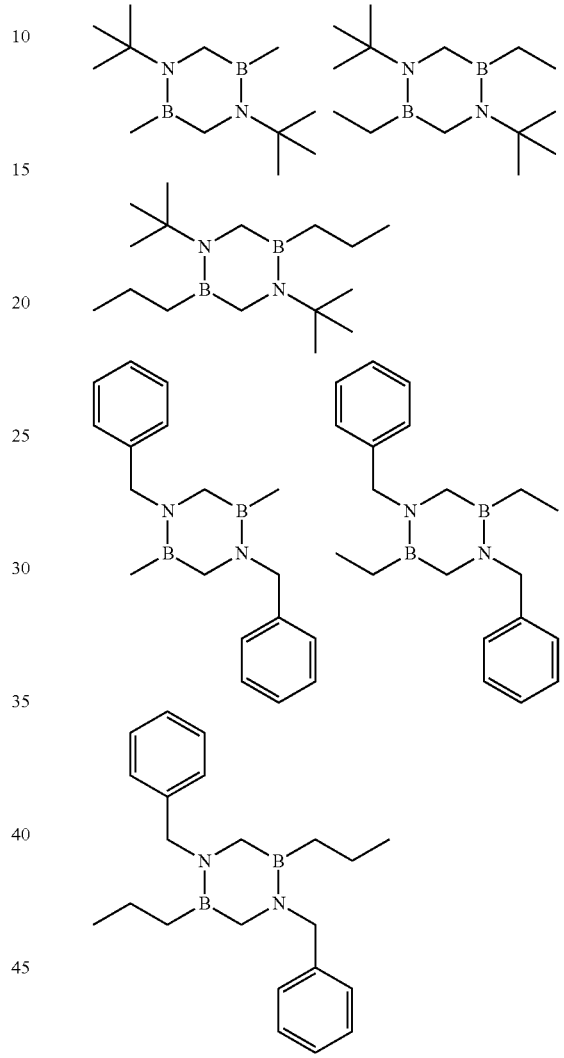

The content of the impurity diffusion component (A) in the diffusing agent composition is not particularly limited. The content of the impurity diffusion component (A) in the diffusing agent composition is preferably 0.01 to 20% by mass, is more preferably 0.05 to 15% by mass and is particularly preferably 0.1 to 10% by mass.

The ratio (mass ratio) between the content of the first boron compound (A1) and the content of the second boron compound (A2) in the diffusing agent composition is preferably 0.05:1 to 4:1, is more preferably 0.1:1 to 3:1 and is particularly preferably 0.2:1 to 2.5:1, as the content of the first boron compound (A1):the content of the second boron compound (A2). It is considered that the diffusing agent composition contains the first boron compound (A1) and the second boron compound (A2) at the ratio described above so as to be able to form a homogenous film having a high boron content, and that thus it is possible to satisfactorily perform diffusion even at a low temperature.

[Hydrolyzable Silane Compound (B)]

The diffusing agent composition may contain a hydrolyzable silane compound (B). In a case where the diffusing agent composition contains the hydrolyzable silane compound (B), when the diffusing agent composition is applied to the semiconductor substrate so as to form a thin film, the hydrolyzable silane compound is hydrolytically condensed so as to form an extremely thin film of a silicon oxide system within the coating film. When the extremely thin film of the silicon oxide system is formed within the coating film, the external diffusion of the impurity diffusion component (A) described above to the outside of the substrate is reduced, and thus even when the film of the diffusing agent composition is a thin film, the impurity diffusion component (A) is easily diffused to the semiconductor substrate satisfactorily and uniformly.

The hydrolyzable silane compound (B) generates a hydroxyl group by hydrolysis, and includes a functional group which is bonded to an Si atom. Examples of the functional group which generates the hydroxyl group by hydrolysis include an alkoxy group, an isocyanate group, a dimethyl amino group and a halogen atom. As the alkoxy group, an aliphatic alkoxy group which has 1 to 5 carbon atoms and which is linear or brunched is preferable. Specific examples of the suitable alkoxy group include a methoxy group, an ethoxy group, an n-propoxy group, an isopropoxy group and an n-butoxy group. As the halogen atom, a chlorine atom, a fluorine atom, a bromine atom and an iodine atom are preferable, and the chlorine atom is more preferable.

As the functional group which generates the hydroxyl group by hydrolysis, in terms of being easily subjected to hydrolysis, the ease of the handling and the acquisition of the hydrolyzable silane compound (B), an isocyanate group and an aliphatic alkoxy group which has 1 to 5 carbon atoms and which is linear or brunched are preferable, and a methoxy group, an ethoxy group and the isocyanate group are more preferable.

Specific examples of the hydrolyzable silane compound (B) including an aliphatic alkoxy group which has 1 to 5 carbon atoms and which is linear or brunched include tetramethoxysilane, tetraethoxysilane, tetra-n-propoxy silane, tetraisopropoxy silane, tetra-n-butoxy silane, tetra-n-pentyloxy silane, trimethoxymonoethoxy silane, dimethoxydiethoxy silane, monomethoxytriethoxy silane, trimethoxy mono-n-propoxy silane, dimethoxydi-n-propoxy silane, monomethoxy tri-n-propoxy silane, trimethoxy mono-n-butoxy silane, dimethoxy di-n-butoxy silane, monomethoxy tri-n-tributoxy silane, trimethoxy mono-n-pentyloxy silane, dimethoxydi-n-pentyloxy silane, monomethoxy tri-n-pentyloxy silane, triethoxy mono-n-propoxy silane, diethoxydi-n propoxy silane, monoethoxy tri-n-propoxy silane, triethoxy mono-n-butoxy silane, diethoxydi-n-butoxy silane, monoethoxytri-n-butoxy silane, triethoxymono-n-pentyloxy silane, diethoxydi-n-pentyloxy silane, monoethoxytri-n-pentyloxy silane, tri-n-propoxymono-n-butoxy silane, di-n-propoxydi-n-butoxy silane, mono-n-propoxytri-n-propoxy silane, tri-n-propoxy mono-n-pentyloxy silane, di-n-propoxydi-n-pentyloxy silane, mono-n-propoxytri-n-pentyloxy silane, tri-n-butoxmono-n-pentyloxy silane, di-n-butoxydi-n-pentyloxy silane, mono-n-butoxytri-n-pentyloxy silane, methyltrimethoxy silane, methyltriethoxy silane, methyltri-n-propoxy silane, methyltri-n-propoxy silane, methyltri-n-butoxy silane, methyltri-n-pentyloxy silane, ethyltrimethoxy silane, ethyltriethoxy silane, ethyltri-n-propoxy silane, ethyltri-n-butoxy silane and ethyl tri-n-pentyloxy silane. Among the hydrolyzable silane compounds (B) described above, one type may be used singly or two or more types may be combined so as to be used. The partially hydrolytically condensed alkoxysilane compound can also be used as the hydrolyzable silane compound (B).

Among them, tetramethoxy silane, tetraethoxy silane, methyltrimethoxy silane, methyltriethoxy silane, ethyltrimethoxy silane and ethyltriethoxy silane are preferable, and tetramethoxy silane and tetraethoxy silane are particularly preferable.

As the hydrolyzable silane compound (B) including an isocyanate group, a compound represented by formula (b1) below is preferable.

(in the formula (b1), $R^{b1}$ represents a hydrocarbon group, and n represents an integer of 3 or 4).

The hydrocarbon group serving as $R^{b1}$ in the formula (b1) is not particularly limited as long as the object of the present invention is not inhibited. As $R^{b1}$, an aliphatic hydrocarbon group having 1 to 12 carbon atoms, an aromatic hydrocarbon group having 1 to 12 carbon atoms and an aralkyl group having 1 to 12 carbon atoms are preferable.

Examples of the suitable aliphatic hydrocarbon group having 1 to 12 carbon atoms include a methyl group, an ethyl group, an n-propyl group, an isopropyl group, an n-butyl group, a sec-butyl group, an isobutyl group, a tert-butyl group, an n-pentyl group, an isopentyl group, a neopentyl group, a cyclopentyl group, an n-hexyl group, a cyclohexyl group, an n-heptyl group, a cycloheptyl group, an n-octyl group, a cyclooctyl group, an n-nonyl group, an n-decyl group, an n-undecyl group and an n-dodecyl group.

Examples of the suitable aromatic hydrocarbon group having 1 to 12 carbon atoms include a phenyl group, a 2-methylphenyl group, a 3-methylphenyl group, a 4-methylphenyl group, a 2-ethylphenyl group, a 3-ethylphenyl group, a 4-ethylphenyl group, an α-naphthyl group, a β-naphthyl group and a biphenylyl group.

Examples of the suitable aralkyl group having 1 to 12 carbon atoms include a benzyl group, a phenetyl group, an α-naphthylmethyl group, a β-naphthylmethyl group, a 2-α-naphthylethyl group and a 2-β-naphthylethyl group.

Among the hydrocarbon groups described above, the methyl group and the ethyl group are preferable, and the methyl group is more preferable.

Among the hydrolyzable silane compounds (B) represented by the formula (b1), tetraisocyanate silane, methyltriisocyanate silane and ethyltriisocyanate silane are preferable, and the tetraisocyanate silane is more preferable.

The hydrolyzable silane compound (B) including an isocyanate group and the hydrolyzable silane compound (B) including an aliphatic alkoxy group which has 1 to 5 carbon atoms and which is linear or brunched can also be used together. In this case, a ratio X/Y between the number of moles X of the hydrolyzable silane compound (B) including an isocyanate group and the number of moles Y of the hydrolyzable silane compound (B) including an aliphatic alkoxy group which has 1 to 5 carbon atoms and which is linear or brunched is preferably 1/99 to 99/1, is more preferably 50/50 to 95/5 and particularly preferably 60/40 to 90/10.

The content of the hydrolyzable silane compound (B) in the diffusing agent composition when diffusing agent composition includes the hydrolyzable silane compound (B) is not particularly limited but is preferably 0.001 to 3.0% by mass and is more preferably 0.01 to 1.0% by mass, in terms of Si concentration. The diffusing agent composition contains the hydrolyzable silane compound (B) at such a concentration that the external diffusion of the impurity diffusion component (A) from the thin coating film formed of the diffusing agent composition can be satisfactorily and easily reduced and that the impurity diffusion component can be easily diffused to the semiconductor substrate satisfactorily and uniformly.

[Organic Solvent (S)]

The diffusing agent composition normally contains an organic solvent (S) as a solvent such that a thin coating film can be formed. The type of organic solvent (S) is not particularly limited as long as the object of the present invention is not inhibited.

Preferably, when the diffusing agent composition contains the hydrolyzable silane compound (B), the diffusing agent composition substantially does not contain water. That the diffusing agent composition substantially does not contain water means that the diffusing agent composition does not contain such an amount of water that the hydrolyzable silane compound (B) is hydrolyzed so as not to obtain the desired effect exerted by the addition thereof.

Specific examples of the organic solvent (S) include: monoethers of glycols such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monophenyl ether, dipropylene glycol monomethyl ether, dipropylene glycol monoethyl ether, dipropylene glycol monopropyl ether, dipropylene glycol monobutyl ether, dipropylene glycol monophenyl ether, triethylene glycol monomethyl ether, triethylene glycol monoethyl ether, tripropylene glycol monomethyl ether and tripropylene glycol monoethyl ether; monoethers such as diisopentyl ether (diisoamyl ether), dibutyl ether, diisobutyl ether, tert-butyl methyl ether, benzyl methyl ether, benzyl ethyl ether, dioxane, tetrahydrofuran, anisole, perfluoro-2-butyl tetrahydrofuran and perfluorotetrahydrofuran; chain diethers of glycols such as ethylene glycol dimethyl ether, ethylene glycol diethyl ether, ethylene glycol dipropyl ether, ethylene glycol dibutyl ether, propylene glycol dimethyl ether, propylene glycol diethyl ether, propylene glycol dipropyl ether, propylene glycol dibutyl ether, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether and dipropylene glycol dibutyl ether; cyclic diethers such as 1,4-dioxane; ketones such as 1-octanone, 2-octanone, 1-nonanone, 2-nonanone, acetone, 2-heptanone, 4-heptanone, 1-hexanone, 2-hexanone, 3-pentanone, diisobutyl ketone, cyclohexanone, methylcyclohexanone, phenylacetone, methyl ethyl ketone, methyl isobutyl ketone, ethyl isobutyl ketone, acetyl acetone, acetonyl acetone, ionone, diacetonyl alcohol, acetyl carbinol, acetophenone, methylnaphthyl ketone and isophorone; esters such as methyl acetate, butyl acetate, ethyl acetate, isopropyl acetate, pentyl acetate, isopentyl acetate, ethyl methoxy acetate, ethyl ethoxy acetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, propylene glycol monomethyl ether acetate, propylene glycol monoethyl ether acetate, propylene glycol monopropyl ether acetate, propylene glycol monobutyl ether acetate, propylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxypropionate and isopropyl-3-methoxypropionate, propylene carbonate and γ-butyrolactone; amide solvents having no active hydrogen atom such as N-methyl-2-pyrrolidone, N,N-dimethylacetamide, N,N-dimethylformamide, hexamethylphosphoric triamide and 1,3-dimethyl-2-imidazolidinone; sulfoxides such as dimethylsulfoxide; aliphatic hydrocarbon solvents which may contain a halogen such as pentane, hexane, octane, decane, 2,2,4-trimethylpentane, 2,2,3-trimethylhexane, perfluorohexane, perfluoroheptane, limonene and pinene; aromatic hydrocarbon solvents such as benzene, toluene, xylene, ethylbenzene, propylbenzene, 1-methylpropylbenzene, 2-methylpropylbenzene, diethylbenzene, ethylmethylbenzene, trimethylbenzene, ethyldimethylbenzene and dipropylbenzene; monohydric alcohols such as methanol, ethanol, n-propanol, isopropanol, butanol, isobutanol, 2-methoxyethanol, 2-ethoxyethanol, 3-methyl-3-methoxybutanol, hexanol, cyclohexanol, benzyl alcohol and 2-phenoxyethanol; and glycols such as ethylene glycol, propylene glycol, diethylene glycol and dipropylene glycol. In the illustration of the preferred organic solvents (S) described above, organic solvents containing an ether bond and an ester bond are classified into esters. They may be used singly or two or more types may be combined so as to be used.

When the diffusing agent composition contains the hydrolyzable silane compound (B), the organic solvent (S) which does not have a functional group reacting with the hydrolyzable silane compound (B) is preferably used. In particular, when the hydrolyzable silane compound (B) contains an isocyanate group, the organic solvent (S) which does not have a functional group reacting with the hydrolyzable silane compound (B) is preferably used.

The functional group reacting with the hydrolyzable silane compound (B) includes both a functional group which directly reacts with a group that generates a hydroxyl group by hydrolysis and a functional group which reacts with a hydroxyl group (silanol group) generated by hydrolysis. Examples of the functional group reacting with the hydrolyzable silane compound (B) include a hydroxyl group, a carboxyl group, an amino group and a halogen atom.

Examples of the suitable organic solvent which does not have a functional group reacting with the hydrolyzable silane compound (B) include, among the specific examples of the organic solvents (S) described above, the organic solvents described as the specific examples of mono ethers, chain diethers, cyclic diethers, ketones, esters, amide solvents having no active hydrogen atom, sulfoxides, aliphatic hydrocarbon solvents which may contain halogens and aromatic hydrocarbon solvents.

[Other Components]

The diffusing agent composition may contain various additives such as a surfactant, an antifoaming agent, a pH adjustor and a viscosity modifier as long as the object of the present invention is not inhibited. The diffusing agent composition may further contain a binder resin in order to improve the coating and the film formation. Various resins can be used as the binder resin, and an acrylic resin is preferable.

The predetermined amounts of components described above are each uniformly mixed, and thus it is possible to obtain the diffusing agent composition.

《Method of Manufacturing Semiconductor Substrate》

A method of manufacturing a semiconductor substrate includes:

forming a coating film by applying the diffusing agent composition described above; and diffusing the impurity diffusion component (A) in the diffusing agent composition into the semiconductor substrate. In the following description, a step of forming the coating film is also referred to as a "coating step", and a step of diffusing the impurity diffusion component (A) into the semiconductor substrate is also referred to as a "diffusion step". The coating step and the diffusion step will be sequentially described below.

[Coating Step]

In the coating step, the diffusing agent composition is applied onto the semiconductor substrate so as to form the coating film. The coating step will be described below in the order of the diffusing agent composition, the semiconductor substrate and the coating method.

(Semiconductor Substrate)

As the semiconductor substrate, various substrates that are conventionally used as a target into which the impurity diffusion component is diffused can be used without any restriction in particular. As the semiconductor substrate, a silicon substrate is typically used. Since the impurity diffusion component included in the diffusing agent composition contains boron, as a silicon substrate, an n-type silicon substrate is preferably used. The semiconductor substrate such as a silicon substrate often includes a natural oxide film which is formed as a result of the surface of the semiconductor substrate being naturally oxidized. For example, a silicon substrate often includes a natural oxide film which is mainly formed of $SiO_2$. When the impurity diffusion component is diffused into the semiconductor substrate, the natural oxide film on the surface of the semiconductor substrate is typically removed by use of an aqueous solution of hydrofluoric acid or the like. However, when the diffusing agent composition described above is used, the natural oxide film on the surface of the semiconductor substrate may be removed or may not be removed. When the natural oxide film on the surface of the semiconductor substrate is not removed, as compared with a case where the natural oxide film is removed, the impurity diffusion component may be diffused into the semiconductor substrate somewhat satisfactorily. For example, when a natural oxide film on the surface of a silicon substrate is not removed, it is considered that boron atoms (boron compound) are taken into the natural oxide film in which the density of silicon is relatively low, and that thus the boron atoms (boron compound) are efficiently taken into the surface layer of the semiconductor substrate. It is estimated that consequently, on the surface of the semiconductor substrate, a thin film like borosilicate glass is formed, and that thus boron is satisfactorily diffused into the semiconductor substrate.

The semiconductor substrate may have a three-dimensional structure on its surface onto which the diffusing agent composition is applied. According to the present invention, even when the semiconductor substrate has, on its surface, the three-dimensional structure, in particular, a three-dimensional structure having a small pattern on a nanometer scale, the impurity diffusion component can be diffused satisfactorily and uniformly into the semiconductor substrate, for example, by forming the thin coating film on the semiconductor substrate through the application of the diffusing agent composition described above so as to have a film thickness of 30 nm or less.

The shape of the pattern is not particularly limited. However, typical examples thereof include linear or curved lines or grooves whose cross-sectional shape is rectangular and a hole shape.

When the semiconductor substrate has, on its surface, a pattern in which a plurality of parallel lines serving as the three-dimensional structure are repeatedly arranged, a width between the lines can be set equal to or less than 1 μm, equal to or less than 100 nm, equal to or less than 60 nm or equal to or less than 20 nm. The height of the lines can be set equal to or more than 30 nm, equal to or more than 100 nm, equal to or more than 1 μm or equal to or more than 5 μm.

(Coating Method)

The film thickness of the coating film formed of the diffusing agent composition is not particularly limited. The diffusing agent composition is applied onto the semiconductor substrate such that the film thickness of the coating film formed of the diffusing agent composition is preferably equal to or less than 30 nm and is more preferably equal to or less than 1 to 10 nm. The coating film may be heated to 100 to 300° C., and may be preferably heated to about 150 to 250° C. The heating time is not particularly limited but the heating time is, for example, about 60 to 180 seconds. The heating described above is performed, and thus it is recognized that the stability of the film tends to be enhanced. The method of applying the diffusing agent composition is not particularly limited as long as the coating film having a desired film thickness can be formed. As the method of applying the diffusing agent composition, a spin coat method, an inkjet method and a spray method are preferable. The film thickness of the coating film is the average value of film thicknesses at 5 or more points which are measured with an ellipsometer.

The film thickness of the coating film is set to an arbitrary film thickness as necessary according to the shape of the semiconductor substrate and the degree of diffusion of the impurity diffusion component (A) which is arbitrarily set.

It is also preferable to rinse the surface of the semiconductor substrate with an organic solvent while the diffusing agent composition is being applied to the surface of the semiconductor substrate. The surface of the semiconductor substrate is rinsed during the formation of the coating film, and thus the film thickness of the coating film can be made more uniform. In particular, when the semiconductor substrate has a three-dimensional structure on its surface, the film thickness of the coating film is easily increased at the bottom portion (step portion) of the three-dimensional structure. However, the surface of the semiconductor substrate is rinsed after the formation of the coating film, and thus the film thickness of the coating film can be made uniform.

As the organic solvent used for the rinsing, the organic solvent which may contain the diffusing agent composition and which is described previously can be used.

[Diffusion Step]

In the diffusion step, the impurity diffusion component (A) in the thin coating film formed of the diffusing agent composition on the semiconductor substrate is diffused into the semiconductor substrate. The method of diffusing the impurity diffusion component (A) into the semiconductor substrate is not particularly limited as long as the method is a method of diffusing the impurity diffusion component (A), by heating, from the coating film formed of the diffusing agent composition.

As a typical method, a method of heating, in a heating furnace such as an electric furnace, the semiconductor substrate having the coating film formed of the diffusing agent composition is mentioned. Here, the heating conditions are not particularly limited as long as the impurity diffusion component (A) is diffused to the desired extent.

In general, under an atmosphere containing oxygen, an organic substance in the coating film is fired so as to be removed, thereafter under an atmosphere of an inert gas, the semiconductor substrate is heated and thus the impurity diffusion component (A) is diffused into the semiconductor substrate. The heating for firing the organic substance is preferably performed at 300 to 1000° C. and is more preferably performed at about 400 to 800° C., and the heating is also preferably performed for 1 second to 10 minutes and is more preferably performed for 5 seconds to 5 minutes. The heating for diffusing the impurity diffusion component (A) is preferably performed at a temperature equal to or more than 700° C. but equal to or less than 1400° C. and is more preferably performed at a temperature equal to or more than 700° C. but less than 1200° C., and the heating is also preferably performed for 1 to 120 minutes and is more preferably performed for 5 to 60 minutes. Since the diffusing agent composition containing the impurity diffusion component (A) described previously is used, for example, even when the temperature at the time of diffusion is so low as to be equal to or less than 1000° C., the impurity diffusion component (A) is satisfactorily diffused into the semiconductor substrate. In the case of the typical composition of the present invention, since only a small amount of organic substance is contained, the heating for firing may be skipped.

When the semiconductor substrate can be rapidly increased in temperature to a predetermined diffusion temperature at a rate of temperature increase of 25° C./second or more, the holding time of the diffusion temperature may be so short as to be equal to or less than 60 seconds, equal to or less than 30 seconds, equal to or less than 10 seconds or less than 1 second. In this case, in a shallow region of the surface of the semiconductor substrate, a high concentration of impurity diffusion component (A) is easily diffused.

According to the method described above, even when a semiconductor substrate is used which includes, on its surface, a three-dimensional structure having small air gaps on a nanometer scale, it is possible to diffuse an impurity diffusion component into the semiconductor substrate satisfactorily and uniformly while reducing the occurrence of a defect in the semiconductor substrate. Hence, the method according to the present invention can be suitably applied to the manufacturing of a multi-gate element which has a small three-dimensional structure. Since the method according to the present invention can reduce the occurrence of a defect in the semiconductor substrate when the impurity diffusion component is diffused, in particular, it can be suitably applied to an element such as a CMOS image sensor and the manufacturing of a semiconductor element such as a logic LSI device.

EXAMPLES

Although the present invention will be more specifically described below using examples, the present invention is not limited to the examples below.

Comparative Examples 1 to 5

In comparative examples 1 to 5, compounds A1 to A5 below were used as impurity diffusion components ((A) components).

A1: trimethyl borate
A2: decaborane
A3: compound (triethylamine borane) represented by formula below
A4: dibutyl vinyl boronate
A5: compound (tris (n-amyloxy) boroxine) represented by formula below

[Formula 12]

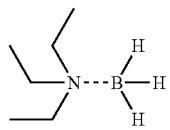

A3

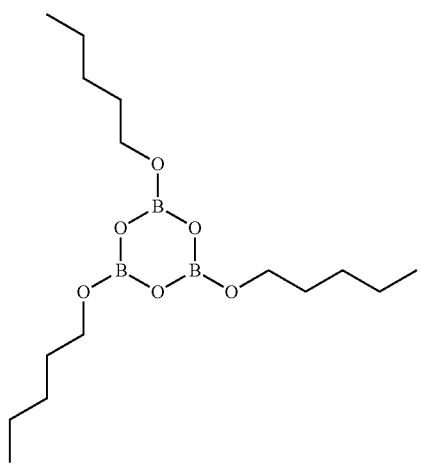

A5

The types of (A) components described in table 1 below were individually dissolved in butyl acetate so as to have a concentration of 0.5% by mass, and thus the diffusing agent compositions of comparative examples 1 to 5 were obtained.

On the surface of a silicon substrate (6 inches, n-type) having a flat surface, the diffusing agent compositions of comparative examples 1 to 5 were individually applied with a spin coater, and thus coating films having film thicknesses described in table 1 were formed. As the silicon substrate, a substrate was used in which a natural oxide film on its surface was removed by immersion in a hydrofluoric acid aqueous solution having a concentration of 0.5% by mass. The observation results of the states of the coating films were described in table 1. In the diffusing agent composition of comparative example 4 using A4 (dibutyl vinyl boronate), no coating film was adhered to the substrate, and thus impurity diffusion was not performed. After the formation of the coating film, diffusion processing on the impurity diffusion components was performed according to the following method. With a rapid thermal anneal device (lamp anneal device), under an atmosphere of nitrogen having a flow rate of 1 L/m, heating was performed under conditions of a rate of temperature increase of 25° C./second, and the diffusion processing was performed at diffusion temperatures described in table 1 for a diffusion time of 1 second. The start point of the diffusion time is the time when the temperature of the substrate reached the predetermined diffusion temperature. After the completion of the diffusion, the temperature of the semiconductor substrate was rapidly cooled to room temperature.

Whether or not the semiconductor substrate was inverted from the n-type to the p-type as a result of the diffusion processing on the impurity diffusion component was confirmed. A case where the semiconductor substrate was inverted is evaluated to be o, and a case where the semiconductor substrate was not inverted is evaluated to be x. When the semiconductor substrate was inverted, a sheet resistance value was measured. The results of these evaluations are described in table 1. Diffusion tests were performed sequentially from a diffusion test at 1200° C., and diffusion tests at temperatures lower than a temperature at which the evaluation of x was first made were not performed.

TABLE 1

| | Component | Coating film thickness | | Upper stage: Diffusion evaluation Lower stage: Sheet resistance value (Ω/sq.) | | |
| --- | --- | --- | --- | --- | --- | --- |
| | (A) | Film | | Diffusion temperature (° C.) | | |
| | Type | thickness (nm) | State | 1200 | 1100 | 1000 |
| Comp. ex. 1 | A1 | 0.1~0.2 | Generation of particles | o 20008 | x — | — — |
| Comp. ex. 2 | A2 | 0.1~0.2 | Generation of particles | o 10653 | x 49557 | x — |
| Comp. ex. 3 | A3 | 0.1 | — | o 3708 | x — | — |
| Comp. ex. 4 | A4 | 0 | — | — | — | — |
| Comp. ex. 5 | A5 | 4.0 | Generation of particle, tarnishing | o 248 | o 627 | o 1349 |

It is found from comparative examples 1 to 5 that when various boron compounds were used singly as the impurity diffusing agent compositions, at low diffusion temperatures of 1000° C. or less, the impurity diffusion components were not satisfactorily diffused (comparative examples 1 to 3), the coating film was not formed (comparative example 4) and in the formed coating films, failures such as the generation of particles and tarnishing occur (comparative example 1, comparative example 2 and comparative example 5).

Comparative Example 6 to Comparative Example 11

In comparative examples 6 to 11, compounds A6 to A11 below were used as impurity diffusion components ((A) components).
A6: compound (tetrakis (dimethylamino) diboron) represented by formula below
A7: compound (diethyl (3-pyridyl) borane) represented by formula below
A8: compound (trispyrrolidinoborane) represented by formula below
A9: compound (diazaborocyclohexane) represented by formula below
A10: compound (diisopropylaminoborane) represented by formula below
A11: boric acid

[Formula 13]

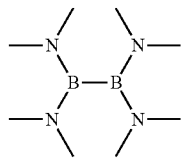

A6

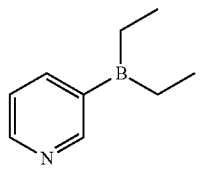

A7

-continued

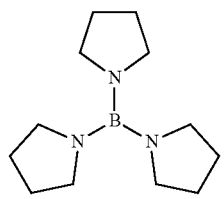

A8

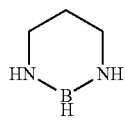

A9

-continued

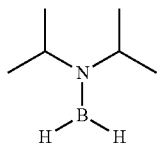
A10

The types of (A) components described in table 2 below were individually dissolved in the organic solvent (S) so as to have a concentration of 0.5% by mass, and thus the diffusing agent compositions of comparative examples 1 to 5 were obtained. In comparative examples 6 to 10, as the organic solvent (S), butyl acetate was used. In comparative example 11, as the organic solvent (S), a mixed solvent of PE (propylene glycol monomethyl ether)/water was used.

On the surface of the silicon substrate (6 inches, n-type) having the flat surface, the diffusing agent compositions of comparative examples 6 to 11 were individually applied with the spin coater, and thus coating films having film thicknesses described in table 2 were formed. As the silicon substrate, the substrate was used in which the natural oxide film on its surface was removed by immersion in the hydrofluoric acid aqueous solution having a concentration of 0.5% by mass. In comparative examples 6 and 9, rising was performed with butyl acetate during the application. The observation results of the states of the coating films were described in table 2. On the diffusing agent composition of comparative example 10 using A10 (diisopropylaminoborane), the impurity diffusion was not performed because the coating film was not adhered on the substrate. After the formation of the coating film, the diffusion processing on the impurity diffusion components was performed according to the following method. With the rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature (1000° C.) described in table 2 for a diffusion time of 1 second. The start point of the diffusion time is the time when the temperature of the substrate reached the predetermined diffusion temperature. After the completion of the diffusion, the temperature of the semiconductor substrate was rapidly cooled to room temperature.

In each of comparative examples 6 to 9 and comparative example 11, by the diffusion processing at 1000° C., the semiconductor substrate was inverted from the n-type to the p-type. The measurement values of the sheet resistances are described in table 2.

TABLE 2

| | Component (A) Type | Rinse | Coating film thickness Film thickness (nm) | State | Sheet resistance value (Ω/sq.) Diffusion temperature (° C.) 1000 |
|---|---|---|---|---|---|
| Comp. ex. 6 | A6 | Done | 1.7 | Tarnishing | 9699 |
| Comp. ex. 7 | A7 | Not done | 27.0 | — | 7337 |
| Comp. ex. 8 | A8 | Not done | 10.4 | Tarnishing | 172 |
| Comp. ex. 9 | A9 | Done | 23.9 | Tarnishing | 254 |
| Comp. ex. 10 | A10 | Not done | 0 | — | — |
| Comp. ex. 11 | A11 | Not done | 8.3 | Tarnishing, non-uniform film thickness | 147 |

It is found from comparative examples 6 to 11 that when various boron compounds were used singly as the impurity diffusing agent compositions, at 1000° C., the impurity diffusion components were not satisfactorily diffused (comparative example 6 and comparative example 7), the coating film was not formed (comparative example 10) and in the formed coating films, failures such as the generation of particles and tarnishing occur (comparative example 6, comparative example 8, comparative example 9 and comparative example 11).

Comparative Example 12 to 26

In comparative examples 12 to 26, the compounds A1, A2, A4, A5, A6, A7, A9 and A10 described above, A12, A13 and A14 below and A15 (tris (trimethylsilyl) borate) were used as impurity diffusion components ((A) components).

A12: compound (N, N', N"-tri-tert-butyl borazine) represented by formula below
A13: compound (N, N', N"-tri-ethyl borazine) represented by formula below
A14: compound (N, N'-di-tert-butyl-1,3-diazaborocylopentane) represented by formula below

[Formula 14]

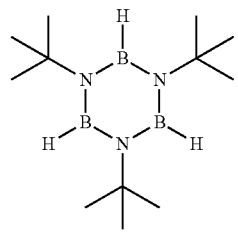
A12

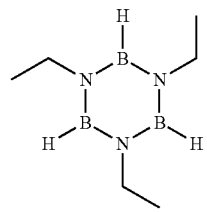
A13

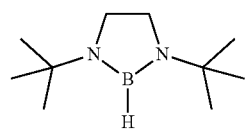
A14

A2, A4, A10, A12 and A13 correspond to the first boron compound (A1) ((A1) components), A14 corresponds to the second boron compound (A2) ((A2) component) and A1, A5, A6, A7, A9 and A15 correspond to the other boron compounds (the other components).

The types of (A) components described in table 3 below were individually dissolved in butyl acetate so as to have concentrations described in table 3 below, and thus the diffusing agent compositions of comparative examples 12 to 26 were obtained.

On the surface of the silicon substrate (6 inches, n-type) having the flat surface, the diffusing agent compositions of comparative examples 12 to 26 were individually applied with the spin coater, and thus coating films having film thicknesses described in table 3 were formed. As the silicon substrate, the substrate was used in which the natural oxide film on its surface was removed by immersion in the hydrofluoric acid aqueous solution having a concentration of 0.5% by mass. The observation results of the states of the coating films were described in table 3. In the diffusing agent compositions of comparative example 15, comparative example 18 and comparative example 20, the coating film was little adhered onto the substrate, and thus the impurity diffusion was not performed. After the formation of the coating film, the diffusion processing on the impurity diffusion components was performed according to the following method. With the rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature (1000° C.) described in table 3 for a diffusion time of 1 second. The start point of the diffusion time is the time when the temperature of the substrate reached the predetermined diffusion temperature. After the completion of the diffusion, the temperature of the semiconductor substrate was rapidly cooled to room temperature.

In each of comparative examples 12 to 14, comparative example 16, comparative example 17, comparative example 19 and comparative examples 21 to 26, by the diffusion processing at 1000° C., the semiconductor substrate was inverted from the n-type to the p-type. The measurement values of the sheet resistances are described in table 3.

TABLE 3

| | Component (A) | | | Coating film thickness | | Sheet resistance value (Ω/sq.) |
|---|---|---|---|---|---|---|
| | Component (A1) Type/ Mass % | Component (A2) Type/ Mass % | Other components Type/ Mass % | Film thickness (nm) | State | Diffusion temperature (° C.) 1000 |
| Comp. ex. 12 | A4/0.1 | — | A7/0.5 | 35.7 | Non-uniform film thickness | 418 |
| Comp. ex. 13 | A2/0.03 | — | A7/0.5 | 34.2 | Non-uniform film thickness | 251 |
| Comp. ex. 14 | — | A14/0.5 | A7/0.1 | 9.1 | Non-uniform film thickness | 796 |
| Comp. ex. 15 | A4, A10/ 0.2, 0.8 | — | — | 0~2.7 | Film instability | — |
| Comp. ex. 16 | A4/0.2 | — | A9/0.8 | 35.3 | Tarnishing, non-uniform film thickness | 168 |
| Comp. ex. 17 | A4/0.2 | — | A6/0.8 | 3.5 | Tarnishing, non-uniform film thickness | 598 |
| Comp. ex. 18 | A4, A12/ 0.2, 0.8 | — | — | 0.1 | Tarnishing, non-uniform film thickness | — |
| Comp. ex. 19 | A12/1.0 | — | — | — | Shape of particles | 1585~4028 |
| Comp. ex. 20 | A13/1.0 | — | — | 0 | No film formed | — |
| Comp. ex. 21 | A4/0.1 | — | A5/0.5 | 2.8 | Tarnishing | 1539 |
| Comp. ex. 22 | A4/0.1 | — | A5/0.25 | 1.9 | Tarnishing | 6636 |
| Comp. ex. 23 | — | A14/1.0 | A5/0.5 | 21.0 | Tarnishing | 184 |
| Comp. ex. 24 | — | A14/1.0 | A15/0.5 | 13.1 | Tarnishing | 180 |
| Comp. ex. 25 | — | A14/1.0 | A1/0.5 | 24.5 | Tarnishing | 169 |
| Comp. ex. 26 | — | A14/1.0 | A3/0.5 | 1.3 | — | 9763 |

It is found from comparative examples 12 to 26 that when the first boron compound (A1) and the second boron compound (A2) were not combined as the impurity diffusion component (A), at low diffusion temperatures of 1000° C. or less, the impurity diffusion components were not satisfactorily diffused (comparative example 26), coating films having sufficient film thicknesses were not formed (comparative example 15, comparative example 18 and comparative example 20) and in the formed coating films, failures such as the non-uniformity of the film thickness, the adherence of the diffusing agent composition in the shape of particles to the silicon substrate and tarnishing occur (comparative examples 12 to 14, comparative examples 16 to 19 and comparative examples 21 to 25).

Examples 1 to 22

In examples 1 to 22, the compounds A2, A4, A10, A13 and A14 described above were used as impurity diffusion components ((A) components). A2, A4, A10 and A13 correspond to the first boron compound (A1) ((A1) components), and A14 corresponds to the second boron compound (A2) ((A2) component).

The types of (A) components described in table 4 below were individually dissolved in butyl acetate so as to have concentrations described in table 4 below, and thus the diffusing agent compositions of examples 1 to 22 were obtained.

On the surface of the silicon substrate (6 inches, n-type) having the flat surface, the diffusing agent compositions of examples 1 to 22 were individually applied with the spin coater, and thus coating films having film thicknesses described in table 4 were formed. As the silicon substrate, the substrate was used in which the natural oxide film on its surface was removed by immersion in the hydrofluoric acid aqueous solution having a concentration of 0.5% by mass. In examples where "rinse done" is described in table 4, rinsing was performed with butyl acetate during the application. In each of examples 1 to 22, no particular failure occurred in the state of the formed coating film. After the formation of the coating film, the diffusion processing on the impurity diffusion components was performed according to the following method. With the rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature (1000° C.) described in table 4 for a diffusion time of 1 second. The start point of the diffusion time is the time when the temperature of the substrate reached the predetermined diffusion temperature. After the completion of the diffusion, the temperature of the semiconductor substrate was rapidly cooled to room temperature.

In each of examples 1 to 22, by the diffusion processing at 1000° C., the semiconductor substrate was inverted from the n-type to the p-type. The measurement values of the sheet resistances are described in table 4.

TABLE 4

|  | Component (A) | | | | | Sheet resistance value (Ω/sq.) |
|---|---|---|---|---|---|---|
|  | Component (A1) Type/ Mass % | Component (A2) Type/ Mass % | Other components Type/ Mass % | Coating film thickness (nm) | Rinse | Diffusion temperature (° C.) 1000 |
| Ex. 1 | A2/0.5 | A14/1.0 | — | 121.3 | Not done | 186 |
| Ex. 2 |  |  |  | 8.3 | Done | 222 |
| Ex. 3 | A4/0.5 | A14/1.0 | — | 34.2 | Not done | 196 |
| Ex. 4 |  |  |  | 3.0 | Done | 2038 |
| Ex. 5 | A10/0.5 | A14/1.0 | — | 3.2 | Not done | 549 |
| Ex. 6 | A2/0.1 | A14/1.0 | — | 34.1 | Not done | 176 |
| Ex. 7 | A2/0.1 | A14/0.5 | — | 28.9 | Not done | 188 |
| Ex. 8 | A2/0.05 | A14/0.5 | — | 15.8 | Not done | 187 |
| Ex. 9 |  |  |  | 3.6 | Done | 641 |
| Ex. 10 | A2/0.03 | A14/0.5 | — | 10.2 | Not done | 183 |
| Ex. 11 | A2/0.03 | A14/0.3 | — | 9.5 | Not done | 200 |
| Ex. 12 | A2/0.015 | A14/0.3 | — | 5.9 | Not done | 371 |
| Ex. 13 |  |  |  | 3.9 | Done | 1188 |
| Ex. 14 | A4/0.1 | A14/1.0 | — | 7.5 | Not done | 305 |
| Ex. 15 | A4/0.1 | A14/0.5 | — | 5.5 | Not done | 437 |
| Ex. 16 |  |  |  | 1.6 | Done | 2667 |
| Ex. 17 | A4/0.1 | A14/0.3 | — | 4.9 | Not done | 371 |
| Ex. 18 |  |  |  | 2.7 | Done | 2212 |
| Ex. 19 | A4/0.1 | A14/0.1 | — | 2.5 | Not done | 2215 |
| Ex. 20 |  |  |  | 1.3 | Done | 2786 |
| Ex. 21 | A13/0.2 | A14/0.8 | — | 2.2 | Not done | 1125 |
| Ex. 22 |  |  |  | 1.3 | Done | 1612 |

It is found from examples 1 to 22 that when the first boron compound (A1) and the second boron compound (A2) were combined as the impurity diffusion component (A) so as to be used, at low diffusion temperatures of 1000° C. or less, the impurity diffusion components were satisfactorily diffused, and in the formed coating films, failures such as the non-uniformity of the film thickness and tarnishing were unlikely to occur. The diffusing agent compositions of the examples were stored in the atmosphere for 3 hours or 6 hours, and thereafter the diffusion processing was performed on the semiconductor substrate. Consequently, between the test using the diffusing agent composition immediately after the preparation and the test using the diffusing agent composition after storage for the predetermined time, the sheet resistance values were not significantly changed, and thus the storage stability of the diffusing agent compositions in the examples were satisfactory.

Examples 23 to 29

In examples 23 to 29, the compounds A2, A4 and A14 described above were used as impurity diffusion components ((A) components). A2 and A4 correspond to the first boron compound (A1) ((A1) components), and A14 corresponds to the second boron compound (A2) ((A2) component).

The types of (A) components described in table 5 below were individually dissolved in butyl acetate so as to have concentrations described in table 5 below, and thus the diffusing agent compositions of examples 23 to 29 were obtained.

On the surface of the silicon substrate (6 inches, n-type) having the flat surface, the diffusing agent compositions of examples 23 to 29 were individually applied with the spin coater, and thus coating films having film thicknesses described in table 5 were formed. As the silicon substrate, the substrate was used in which the natural oxide film on its surface was removed by immersion in the hydrofluoric acid aqueous solution having a concentration of 0.5% by mass. During the application, rising was performed with diisoamyl ether. In each of examples 23 to 29, no particular failure occurred in the state of the formed coating film. After the formation of the coating film, the diffusion processing on the impurity diffusion components was performed according to the following method. With the rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature (1000° C.) described in table 5 for a diffusion time of 1 second. The start point of the diffusion time is the time when the temperature of the substrate reached the predetermined diffusion temperature. After the completion of the diffusion, the temperature of the semiconductor substrate was rapidly cooled to room temperature.

In each of examples 23 to 29, by the diffusion processing at 1000° C., the semiconductor substrate was inverted from the n-type to the p-type. The measurement values of the sheet resistances are described in table 5.

TABLE 5

| | Component (A) | | | | Sheet resistance |
| | Component (A1) Type/ Mass % | Component (A2) Type/ Mass % | Other components Type/ Mass % | Coating film thickness (nm) | value (Ω/sq.) Diffusion temperature (° C.) 1000 |
|---|---|---|---|---|---|
| Ex. 23 | A4, A2/ 0.1, 0.01 | A14/0.5 | — | 5.7 | 427 |
| Ex. 24 | A4, A2/ 0.2, 0.01 | A14/0.8 | — | 10.3 | 209 |
| Ex. 25 | A4/0.2 | A14/0.8 | — | 7.9 | 324 |
| Ex. 26 | A4/0.3 | A14/0.8 | — | 10.0 | 236 |
| Ex. 27 | A4/0.4 | A14/0.8 | — | 13.4 | 212 |
| Ex. 28 | A4/0.3 | A14/0.6 | — | 9.0 | 423 |
| Ex. 29 | A4/0.6 | A14/0.3 | — | 10.2 | 508 |

It is found from example 23 and example 24 that even when a plurality of types of first boron compounds (A1) were combined with the second boron compound, no particular problem occurred. When example 27 and example 4 where the concentrations of the impurity diffusion components (A) were relatively close to each other are compared with each other, it is found that in a case where rinsing was performed with diisoamyl ether, as compared with a case where rinsing was performed with butyl acetate, a decrease in the film thickness caused by rinsing was reduced and that thus the coating film which was so thick as to be advantageous in the diffusion of impurities was easily formed. Furthermore, it is found from example 29 that even when a large amount of first boron compound (A1) was used as compared with the second boron compound (A2), no particular problem occurred.

Examples 30 to 36

In examples 30 to 36, the compounds A4, A14 and A16 described above were used as impurity diffusion components ((A) components). A16 is n-propylboronate-di-n-butyl. A4 and A16 correspond to the first boron compound (A1) ((A1) components), and A14 corresponds to the second boron compound (A2) ((A2) component).

The types of (A) components described in table 6 below were individually dissolved in butyl acetate so as to have concentrations described in table 6 below, and thus the diffusing agent compositions of examples 30 to 36 were obtained.

On the surface of the silicon substrate (6 inches, n-type) having the flat surface, the diffusing agent compositions of examples 30 to 36 were individually applied with the spin coater, and thus coating films having film thicknesses described in table 6 were formed. As the silicon substrate, the substrate was used in which the natural oxide film on its surface was removed by immersion in the hydrofluoric acid aqueous solution having a concentration of 0.5% by mass. The film thickness of the coating film was prepared by adjusting the number of revolutions of the spin coater. During the application, rising was performed with the types of solvents described in table 6. In table 6, DBE represents dibutyl ether, and DIAE represents diisoamyl ether. In each of examples 30 to 36, no particular failure occurred in the state of the formed coating film. In examples 30 to 33, before the diffusion processing, the coating film was heated at 200° C. for 1 minute. After the formation of the coating film, the diffusion processing on the impurity diffusion components was performed according to the following method. With the rapid thermal anneal device (lamp anneal device), under an atmosphere of nitrogen having a flow rate of 1 L/m, heating was performed under conditions of a rate of temperature increase of 25° C./second, and the diffusion processing was performed at diffusion temperatures for diffusion times described in table 6. The start point of the diffusion time is the time when the temperature of the substrate reached the predetermined diffusion temperature. After the completion of the diffusion, the temperature of the semiconductor substrate was rapidly cooled to room temperature.

In each of examples 30 to 36, the semiconductor substrate was inverted from the n-type to the p-type. The measurement values of the sheet resistances are described in table 6.

TABLE 6

| | Component (A) | | | | | | | |
|---|---|---|---|---|---|---|---|---|
| | Component (A1) Type/ Mass % | Component (A2) Type/ Mass % | Other components Type/ Mass % | Coating film thickness (nm) | Rinse solvent | Diffusion temperature (° C.) | Diffusion time (seconds) | Sheet resistance value (Ω/sq.) |
| Ex. 30 | A4/0.8 | A14/0.8 | — | 5.1 | DBE | 1000 | 1 | 370 |
| Ex. 31 | | | | | | 950 | 1 | 503 |
| Ex. 32 | | | | 1.9 | | 950 | 25 | 3320 |
| Ex. 33 | | | | | | 950 | 1 | 6364 |
| Ex. 34 | A16/0.3 | A14/0.8 | — | 4.2 | | 950 | 25 | 496 |
| Ex. 35 | A4/0.2 | A14/0.8 | — | 4.9 | DIAE | 900 | 32 | 1829 |
| Ex. 36 | | | | | | 900 | 1 | 3337 |

Examples 37 to 44

In examples 37 to 44, the diffusing agent compositions used in examples 35 and 36 were used. On the surface of the silicon substrate (6 inches, n-type) having the flat surface, diffusing agent compositions were individually applied with the spin coater, and thus coating films were formed. As the silicon substrate, the substrate was used in which the natural oxide film on its surface was removed by immersion in the hydrofluoric acid aqueous solution having a concentration of 0.5% by mass. During the application, rising was performed with the types of solvents described in table 7 in a state where the substrate was rotated. In table 7, DBE represents dibutyl ether, DIAE represents diisoamyl ether and TBME represents tert-butyl methyl ether. The film thicknesses of the formed coating films are described in table 7. In each of examples 37 to 44, no particular failure occurred in the state of the formed coating film.

After the formation of the coating film, the diffusion processing on the impurity diffusion components was performed according to the following method. With the rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature of 1000° C. for a diffusion time of 1 second. The start point of the diffusion time is the time when the temperature of the substrate reached the predetermined diffusion temperature. After the completion of the diffusion, the temperature of the semiconductor substrate was rapidly cooled to room temperature.

In each of examples 37 to 44, the semiconductor substrate was inverted from the n-type to the p-type. The measurement values of the sheet resistances are described in table 7.

It is found from table 7 that in examples 37 to 44, regardless of the types of rise solvents, the impurity diffusion components can be satisfactorily diffused.

Example 45

The diffusing agent compositions used in example 25 and example 26 were used. Then, on the surface of a silicon substrate (n-type) having a plurality of grooves whose width was 350 nm and whose depth was 3 μm, the diffusing agent compositions were applied with the spin coater so as to form a coating film having a film thickness of 7 nm. As the silicon substrate, the substrate was used in which the natural oxide film on its surface was removed by immersion in the hydrofluoric acid aqueous solution having a concentration of 0.5% by mass. During the application, rising was performed with diisoamyl ether.

When the cross section of the semiconductor substrate after the formation of the coating film was observed with an electronic microscope, it was found that on the entire inner surface of concave portions (grooves), the coating film was substantially uniformly formed.

Then, with the rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature of 1000° C. for a diffusion time of 10 seconds. The start point of the diffusion time is the time when the temperature of the substrate reached the predetermined diffusion temperature. After the completion of the diffusion, the temperature of the semiconductor substrate was rapidly cooled to room temperature.

TABLE 7

| | Component (A) | | | Number of rotations at time of coating (rpm) | Coating film thickness (nm) | Rinse solvent | Sheet resistance value (Ω/sq.) |
|---|---|---|---|---|---|---|---|
| | Component (A1) Type/ Mass % | Component (A2) Type/ Mass % | Other components Type/ Mass % | | | | |
| Ex. 37 | A4/0.2 | A14/0.8 | — | 700 | 5.1 | DIAE | 1353 |
| Ex. 38 | | | | 500 | 6.5 | | 946 |
| Ex. 39 | | | | 300 | 7.4 | | 552 |
| Ex. 40 | | | | 700 | 4.1 | DBE | 1540 |
| Ex. 41 | | | | 500 | 6.0 | | 978 |
| Ex. 42 | | | | 300 | 6.6 | | 824 |
| Ex. 43 | | | | 700 | 1.4 | TBME | 6180 |
| Ex. 44 | | | | 300 | 2.7 | | 2890 |

When the surface of the semiconductor substrate after the diffusion processing was observed by scanning capacitance microscopy (SCM method) and scanning spreading resistance microscopy (SSRM method), and the carrier distribution of the surface of the semiconductor substrate was checked, it was found that the entire surface of the semiconductor substrate having recesses and projections was substantially uniformly inverted to the p-type.

Examples 46 to 49

In examples 46 to 49, the compounds A4, A14 and A17 described above were used as impurity diffusion components ((A) components). A17 was diisopropyl allyl boronate. A4 and A17 correspond to the first boron compound (A1) ((A1) components), and A14 corresponds to the second boron compound (A2) ((A2) component).

The types of (A) components described in table 8 below were individually dissolved in butyl acetate so as to have concentrations described in table 8 below, and thus the diffusing agent compositions of examples 46 to 49 were obtained.

On the surface of the silicon substrate (6 inches, n-type) having the flat surface, the diffusing agent compositions of examples 46 to 49 were individually applied with the spin coater, and thus coating films having film thicknesses described in table 8 were formed. As the silicon substrate, in examples 47 and 49, a silicon substrate in which the natural oxide film was present on its surface was used without being processed. In examples 46 and 48, a substrate was used in which the natural oxide film on its surface was removed by immersion in the hydrofluoric acid aqueous solution having a concentration of 0.5% by mass. During the application, rising was performed with the types of solvents described in table 8 in a state where the substrate was rotated. In table 8, DBE represents dibutyl ether, and DIAE represents diisoamyl ether. In each of examples 46 to 49, no particular failure occurred in the state of the formed coating film. After the formation of the coating film, the diffusion processing on the impurity diffusion components was performed according to the following method. With the rapid thermal anneal device (lamp anneal device), under an atmosphere of nitrogen having a flow rate of 1 L/m, heating was performed under conditions of a rate of temperature increase of 15° C./second, and the diffusion processing was performed at diffusion temperatures described in table 8 for a diffusion time of 25 seconds. The start point of the diffusion time is the time when the temperature of the substrate reached the predetermined diffusion temperature. After the completion of the diffusion, the temperature of the semiconductor substrate was rapidly cooled to room temperature.

In each of examples 46 to 49, by the diffusion processing under conditions described in table 8, the semiconductor substrate was inverted from the n-type to the p-type. The measurement values of the sheet resistances are described in table 8.

TABLE 8

| | Component (A) | | | | | | |
|---|---|---|---|---|---|---|---|
| | Component (A1) Type/ Mass % | Component (A2) Type/ Mass % | Natural oxide film removal | Coating film thickness (nm) | Rinse solvent | Diffusion temperature (° C.) | Sheet resistance value (Ω/sq.) |
| Ex. 46 | A4/0.2 | A14/0.8 | Done | 6.9 | DIAE | 1000 | 556 |
| Ex. 47 | | | Not done | 6.9 | DIAE | 1000 | 472 |
| Ex. 48 | A17/0.3 | A14/0.6 | Done | 3.2 | DBE | 950 | 797 |
| Ex. 49 | | | Not done | 3.2 | DBE | 950 | 455 |

It is found from examples 46 to 49 that regardless of whether or not the natural oxide film on the surface of the silicon substrate was removed, the impurity diffusion components were satisfactorily diffused into the silicon substrate. It is also found from comparison between example 46 and example 47 and comparison between example 48 and example 49 that when the natural oxide film on the surface of the silicon substrate was not removed, as compared with a case where the natural oxide film was removed, the impurity diffusion components were diffused easily and satisfactorily.

What is claimed is:

1. A diffusing agent composition which is used for diffusing an impurity into a semiconductor substrate,
wherein the diffusing agent composition comprises an impurity diffusion component (A) comprising a first boron compound (A1) and a second boron compound (A2),
wherein the first boron compound (A1) is a boron hydride or a boron compound which can generate, by hydrolysis, one or more types of compounds selected from the group consisting of compounds represented by a formula (a1e) and a formula (a1f) below:

$$B(R^{1a})_2OH \qquad (a1e)$$

$$B(R^{1a})(OH)_2 \qquad (a1f)$$

wherein $R^{1a}$ represents a hydrogen atom or a hydrocarbon group having 1 to 10 carbon atoms, and
wherein the second boron compound (A2) is a boron compound other than the first boron compound (A1), and is one or more selected from the group consisting of compounds represented by formulas (a2a) to (a2d) below:

(a2a)

(a2b)

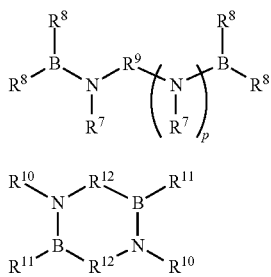
(a2c)

(a2d)

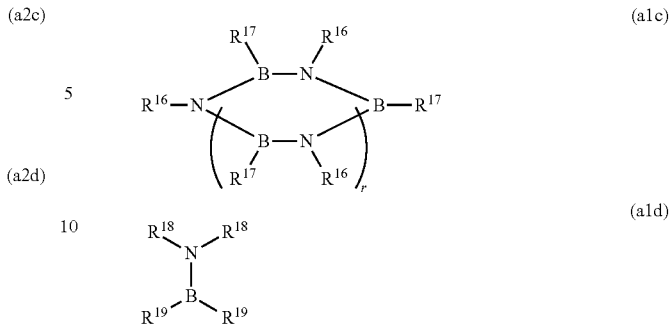
(a1c)

(a1d)

wherein in the formula (a2a), each $R^1$ independently represents a hydrogen atom, a hydrocarbon group having 1 to 10 carbon atoms, $R^2$ represents a hydrogen atom or a hydrocarbon group having 1 to 10 carbon atoms, at least one of $R^1$ and $R^2$ is a hydrocarbon group and $R^3$ represents a divalent aliphatic hydrocarbon group having 1 to 10 carbon atoms;

in the formula (a2b), $R^4$ represents a hydrocarbon group having 1 to 10 carbon atoms, $R^5$ represents a hydrogen atom or a hydrocarbon group having 1 to 10 carbon atoms and $R^6$ represents a divalent aliphatic hydrocarbon group having 1 to 10 carbon atoms;

in the formula (a2c), each $R^7$ independently represents a hydrocarbon group having 1 to 10 carbon atoms, $R^8$ each independently represents a hydrogen atom or a hydrocarbon group having 1 to 10 carbon atoms, $R^9$ represents a divalent hydrocarbon group having 1 to 10 carbon atoms and p represents 0 or 1; and in the formula (a2d), each $R^{10}$ independently represents a hydrogen atom, a hydrocarbon group having 1 to 10 carbon atoms, $R^{11}$ each independently represents a hydrogen atom or a hydrocarbon group having 1 to 10 carbon atoms, at least one of $R^{10}$ and $R^{11}$ is a hydrocarbon group and $R^{12}$ each independently represents a divalent hydrocarbon group having 1 to 10 carbon atoms).

2. The diffusing agent composition according to claim 1, wherein the first boron compound (A1) is one or more selected from the group consisting of a boron hydride having 2 to 10 boron atoms and compounds represented by formulas (a1a) to (a1d) below:

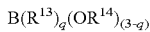
(a1a)

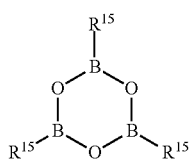
(a1b)

wherein in the formula (a1a), each $R^{13}$ and $R^{14}$ independently represent a hydrocarbon group having 1 to 10 carbon atoms, and q represents an integer of 1 or 2;

in the formula (a1b), each $R^{15}$ independently represents a hydrocarbon group having 1 to 10 carbon atoms;

in the formula (a1c), each $R^{16}$ and $R^{17}$ independently represent a hydrocarbon group having 1 to 10 carbon atoms, and r represents 1 or 2; and in the formula (a1d), each $R^{18}$ and $R^{19}$ independently represent a hydrogen atom or a hydrocarbon group having 1 to 10 carbon atoms.

3. The diffusing agent composition according to claim 1, wherein the diffusing agent composition comprises an organic solvent (S).

4. A method of manufacturing a semiconductor substrate, the method comprising:
forming a coating film by applying the diffusing agent composition according to claim 1 onto the semiconductor substrate; and
diffusing the impurity diffusion component (A) in the diffusing agent composition into the semiconductor substrate.

5. The method of manufacturing a semiconductor substrate according to claim 4, wherein the coating film is heated at a temperature greater than or equal to 700° C. but less than 1200° C. so as to diffuse the impurity diffusion component (A) into the semiconductor substrate.

6. The method of manufacturing a semiconductor substrate according to claim 4, wherein a film thickness of the coating film is 30 nm or less.

7. The method of manufacturing a semiconductor substrate according to claim 4, wherein the semiconductor substrate comprises a three-dimensional structure having a convex portion and a concave portion on a surface onto which the diffusing agent composition is applied.

8. The method of manufacturing a semiconductor substrate according to claim 4, further comprising rinsing the coating film with an organic solvent.

9. A method of diffusing an impurity into a semiconductor substrate, the method comprising applying the diffusing agent composition according to claim 1 onto the substrate.

* * * * *